United States Patent
Manning

(10) Patent No.: US 7,085,975 B2
(45) Date of Patent: *Aug. 1, 2006

(54) METHOD AND APPARATUS FOR GENERATING EXPECT DATA FROM A CAPTURED BIT PATTERN, AND MEMORY DEVICE USING SAME

(75) Inventor: Troy A. Manning, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 233 days.

This patent is subject to a terminal disclaimer.

(21) Appl. No.: 10/648,567

(22) Filed: Aug. 25, 2003

(65) Prior Publication Data

US 2004/0158785 A1    Aug. 12, 2004

Related U.S. Application Data

(60) Continuation of application No. 10/268,351, filed on Oct. 9, 2002, now Pat. No. 6,647,523, which is a continuation of application No. 09/924,139, filed on Aug. 7, 2001, now Pat. No. 6,477,675, which is a division of application No. 09/146,860, filed on Sep. 3, 1998, now Pat. No. 6,349,399.

(51) Int. Cl.
*G11C 29/00* (2006.01)
(52) U.S. Cl. ............... 714/720; 714/738; 714/744
(58) Field of Classification Search ............ 341/59; 370/514, 441; 369/59.26; 380/46; 714/700, 714/707, 709, 720, 738, 744
See application file for complete search history.

(56) References Cited

U.S. PATENT DOCUMENTS 3,633,174 A   1/1972 Griffin .............. 340/172.5

(Continued)

FOREIGN PATENT DOCUMENTS

EP    0 171 720 A2    2/1986

(Continued)

OTHER PUBLICATIONS

Alvarez, J. et al. "A Wide-Bandwidth Low Voltage PLL for PowerPC ™ Microprocessors" IEEE IEICE Trans. Electron., vol. E-78, No. 6, Jun. 1995, pp. 631-639.

(Continued)

*Primary Examiner*—David Ton
(74) *Attorney, Agent, or Firm*—Dorsey & Whitney LLP

(57) ABSTRACT

Expect data signals are generated for a series of applied data signals having a known sequence to determine if groups of the data signals were properly captured. A first group of the applied data signals is captured, and a group of expect data signals are generated from the captured first group. A second group of applied data signals is then captured and determined to have been properly captured when the second group corresponds to the group of expect data signals. In this way, when a captured series of data signals is shifted in time from an expected capture point, subsequent captured data signals are compared to their correct expected data signals in order to determine whether that group, although shifted in time, was nonetheless correctly captured. A pattern generator generates expect data signals in this manner, and may be utilized in a variety of integrated circuits, such as an SLDRAMs.

31 Claims, 11 Drawing Sheets

U.S. PATENT DOCUMENTS

| | | | |
|---|---|---|---|
| 4,004,100 A | 1/1977 | Takimoto | 179/15 BS |
| 4,077,016 A | 2/1978 | Sanders et al. | 331/4 |
| 4,096,402 A | 6/1978 | Schroeder et al. | 307/362 |
| 4,404,474 A | 9/1983 | Dingwall | 307/260 |
| 4,481,625 A | 11/1984 | Roberts et al. | 370/85 |
| 4,508,983 A | 4/1985 | Allgood et al. | 307/577 |
| 4,511,846 A | 4/1985 | Nagy et al. | 328/164 |
| 4,514,647 A | 4/1985 | Shoji | 307/269 |
| 4,524,448 A | 6/1985 | Hullwegen | 375/118 |
| 4,573,017 A | 2/1986 | Levine | 327/114 |
| 4,600,895 A | 7/1986 | Landsman | 331/1 A |
| 4,603,320 A | 7/1986 | Farago | 341/89 |
| 4,638,187 A | 1/1987 | Boler et al. | 307/451 |
| 4,638,451 A | 1/1987 | Hester et al. | 395/889 |
| 4,687,951 A | 8/1987 | McElroy | 307/269 |
| 4,697,167 A * | 9/1987 | O'Keeffe et al. | 341/59 |
| 4,727,541 A | 2/1988 | Mori et al. | 370/112 |
| 4,740,962 A * | 4/1988 | Kish, III | 370/514 |
| 4,746,996 A | 5/1988 | Furuhata et al. | 360/36.2 |
| 4,773,085 A | 9/1988 | Cordell | 375/120 |
| 4,789,796 A | 12/1988 | Foss | 307/443 |
| 4,791,622 A * | 12/1988 | Clay et al. | 369/59.26 |
| 4,818,995 A | 4/1989 | Takahashi et al. | 341/94 |
| 4,893,087 A | 1/1990 | Davis | 328/14 |
| 4,902,986 A | 2/1990 | Lesmeister | 331/25 |
| 4,924,516 A * | 5/1990 | Bremer et al. | 380/46 |
| 4,953,128 A | 8/1990 | Kawai et al. | 365/194 |
| 4,958,088 A | 9/1990 | Farah-Bakhsh et al. | 307/443 |
| 4,972,470 A | 11/1990 | Farago | 380/3 |
| 4,979,185 A | 12/1990 | Bryans et al. | 375/20 |
| 4,984,204 A | 1/1991 | Sato et al. | 365/189.11 |
| 4,984,255 A | 1/1991 | Davis et al. | 375/106 |
| 5,020,023 A | 5/1991 | Smith | 364/900 |
| 5,038,115 A | 8/1991 | Myers et al. | 331/2 |
| 5,062,082 A | 10/1991 | Choi | 365/230.06 |
| 5,075,569 A | 12/1991 | Branson | 307/270 |
| 5,086,500 A | 2/1992 | Greub | 395/550 |
| 5,087,828 A | 2/1992 | Sato et al. | 307/269 |
| 5,113,519 A | 5/1992 | Johnson et al. | 395/600 |
| 5,120,990 A | 6/1992 | Koker | 307/269 |
| 5,122,690 A | 6/1992 | Bianchi | 307/475 |
| 5,128,560 A | 7/1992 | Chern et al. | 307/475 |
| 5,128,563 A | 7/1992 | Hush et al. | 307/482 |
| 5,130,565 A | 7/1992 | Girmay | 307/265 |
| 5,134,311 A | 7/1992 | Biber et al. | 307/270 |
| 5,150,186 A | 9/1992 | Pinney et al. | 357/42 |
| 5,165,046 A | 11/1992 | Hesson | 307/270 |
| 5,168,199 A | 12/1992 | Huffman et al. | 315/370 |
| 5,179,298 A | 1/1993 | Hirano et al. | 307/443 |
| 5,182,524 A | 1/1993 | Hopkins | 330/149 |
| 5,194,765 A | 3/1993 | Dunlop et al. | 307/443 |
| 5,212,601 A | 5/1993 | Wilson | 360/51 |
| 5,220,208 A | 6/1993 | Schenck | 307/443 |
| 5,223,755 A | 6/1993 | Richley | 307/603 |
| 5,229,929 A | 7/1993 | Shimizu et al. | 363/98 |
| 5,233,314 A | 8/1993 | McDermott et al. | 331/17 |
| 5,233,564 A | 8/1993 | Ohshima et al. | 365/230.05 |
| 5,239,206 A | 8/1993 | Yanai | 307/272.2 |
| 5,243,703 A | 9/1993 | Farmwald et al. | 395/325 |
| 5,254,883 A | 10/1993 | Horowitz et al. | 307/443 |
| 5,256,989 A | 10/1993 | Parker et al. | 331/1 A |
| 5,257,294 A | 10/1993 | Pinto et al. | 375/120 |
| 5,268,639 A | 12/1993 | Gasbarro et al. | 324/158 R |
| 5,272,729 A | 12/1993 | Bechade et al. | 375/118 |
| 5,274,276 A | 12/1993 | Casper et al. | 307/443 |
| 5,276,642 A | 1/1994 | Lee | 365/189.04 |
| 5,278,460 A | 1/1994 | Casper | 307/296.5 |
| 5,281,865 A | 1/1994 | Yamashita et al. | 307/279 |
| 5,283,631 A | 2/1994 | Koerner et al. | 307/451 |
| 5,289,580 A | 2/1994 | Latif et al. | 395/275 |
| 5,295,164 A | 3/1994 | Yamamura | 375/120 |
| 5,304,952 A | 4/1994 | Quiet et al. | 331/1 A |
| 5,311,481 A | 5/1994 | Casper et al. | 365/230.06 |
| 5,311,483 A | 5/1994 | Takasugi | 365/233 |
| 5,313,431 A | 5/1994 | Uruma et al. | 365/230.05 |
| 5,315,269 A | 5/1994 | Fujii | 331/1 A |
| 5,315,388 A | 5/1994 | Shen et al. | 348/718 |
| 5,321,368 A | 6/1994 | Hoelzle | 328/63 |
| 5,337,285 A | 8/1994 | Ware et al. | 365/227 |
| 5,341,405 A | 8/1994 | Mallard, Jr. | 375/120 |
| 5,347,177 A | 9/1994 | Lipp | 307/443 |
| 5,347,179 A | 9/1994 | Casper et al. | 307/451 |
| 5,355,391 A | 10/1994 | Horowitz et al. | 375/36 |
| 5,361,002 A | 11/1994 | Casper | 327/530 |
| 5,367,649 A | 11/1994 | Cedar | 395/375 |
| 5,379,299 A | 1/1995 | Schwartz | 370/108 |
| 5,390,308 A | 2/1995 | Ware et al. | 395/400 |
| 5,400,283 A | 3/1995 | Raad | 365/203 |
| 5,402,389 A | 3/1995 | Flannagan et al. | 365/233 |
| 5,408,640 A | 4/1995 | MacIntyre et al. | 395/550 |
| 5,410,263 A | 4/1995 | Waizman | 327/141 |
| 5,416,436 A | 5/1995 | Rainard | 327/270 |
| 5,416,909 A | 5/1995 | Long et al. | 395/275 |
| 5,420,544 A | 5/1995 | Ishibashi | 331/11 |
| 5,424,687 A | 6/1995 | Fukuda | 331/11 |
| 5,428,311 A | 6/1995 | McClure | 327/276 |
| 5,428,317 A | 6/1995 | Sanchez et al. | 331/1 A |
| 5,430,408 A | 7/1995 | Ovens et al. | 327/407 |
| 5,430,676 A | 7/1995 | Ware et al. | 365/189.02 |
| 5,432,823 A | 7/1995 | Gasbarro et al. | 375/356 |
| 5,438,545 A | 8/1995 | Sim | 365/189.05 |
| 5,440,260 A | 8/1995 | Hayashi et al. | 327/278 |
| 5,440,514 A | 8/1995 | Flannagan et al. | 365/194 |
| 5,444,667 A | 8/1995 | Obara | 365/233 |
| 5,446,696 A | 8/1995 | Ware et al. | 365/222 |
| 5,448,193 A | 9/1995 | Baumert et al. | 327/156 |
| 5,451,898 A | 9/1995 | Johnson | 327/563 |
| 5,457,407 A | 10/1995 | Shu et al. | 326/30 |
| 5,463,337 A | 10/1995 | Leonowich | 327/158 |
| 5,465,076 A | 11/1995 | Yamauchi et al. | 331/179 |
| 5,473,274 A | 12/1995 | Reilly et al. | 327/159 |
| 5,473,575 A | 12/1995 | Farmwald et al. | 365/230.06 |
| 5,473,639 A | 12/1995 | Lee et al. | 375/376 |
| 5,485,490 A | 1/1996 | Leung et al. | 375/371 |
| 5,488,321 A | 1/1996 | Johnson | 327/66 |
| 5,489,864 A | 2/1996 | Ashuri | 327/161 |
| 5,497,127 A | 3/1996 | Sauer | 331/17 |
| 5,497,355 A | 3/1996 | Mills et al. | 365/230.08 |
| 5,498,990 A | 3/1996 | Leung et al. | 327/323 |
| 5,500,808 A | 3/1996 | Wang | 364/578 |
| 5,502,672 A | 3/1996 | Kwon | 365/189.05 |
| 5,506,814 A | 4/1996 | Hush et al. | 365/230.03 |
| 5,508,638 A | 4/1996 | Cowles et al. | 326/38 |
| 5,513,327 A | 4/1996 | Farmwald et al. | 395/309 |
| 5,515,403 A | 5/1996 | Sloan et al. | 375/371 |
| 5,532,714 A | 7/1996 | Knapp et al. | 345/114 |
| 5,539,345 A | 7/1996 | Hawkins | 327/150 |
| 5,544,124 A | 8/1996 | Zagar et al. | 365/230.08 |
| 5,544,203 A | 8/1996 | Casasanta et al. | 375/376 |
| 5,550,515 A | 8/1996 | Liang et al. | 331/11 |
| 5,550,783 A | 8/1996 | Stephens, Jr. et al. | 365/233 |
| 5,552,727 A | 9/1996 | Nakao | 327/159 |
| 5,555,429 A | 9/1996 | Parkinson et al. | 395/800 |
| 5,557,224 A | 9/1996 | Wright et al. | 327/115 |
| 5,557,781 A | 9/1996 | Stones et al. | 395/550 |
| 5,563,546 A | 10/1996 | Tsukada | 327/408 |
| 5,568,075 A | 10/1996 | Curran et al. | 327/172 |
| 5,568,077 A | 10/1996 | Sato et al. | 327/199 |
| 5,572,557 A | 11/1996 | Aoki | 375/376 |
| 5,572,722 A | 11/1996 | Vogley | 395/555 |
| 5,574,698 A | 11/1996 | Raad | 365/230.06 |
| 5,576,645 A | 11/1996 | Farwell | 327/94 |
| 5,577,079 A | 11/1996 | Zenno et al. | 375/373 |
| 5,577,236 A | 11/1996 | Johnson et al. | 395/551 |

| | | | |
|---|---|---|---|
| 5,578,940 A | 11/1996 | Dillon et al. ................ 326/30 |
| 5,578,941 A | 11/1996 | Sher et al. .................. 326/34 |
| 5,579,326 A | 11/1996 | McClure ...................... 371/61 |
| 5,581,197 A | 12/1996 | Motley et al. ................ 326/30 |
| 5,589,788 A | 12/1996 | Goto ......................... 327/276 |
| 5,590,073 A | 12/1996 | Arakawa et al. ....... 365/185.08 |
| 5,594,690 A | 1/1997 | Rothenberger et al. 365/189.01 |
| 5,614,855 A | 3/1997 | Lee et al. .................... 327/158 |
| 5,619,473 A | 4/1997 | Hotta ........................ 365/238.5 |
| 5,621,340 A | 4/1997 | Lee et al. ...................... 327/65 |
| 5,621,690 A | 4/1997 | Jungroth et al. ............. 365/200 |
| 5,621,739 A | 4/1997 | Sine et al. .................. 371/22.1 |
| 5,627,780 A | 5/1997 | Malhi ..................... 365/185.09 |
| 5,627,791 A | 5/1997 | Wright et al. ............... 365/222 |
| 5,631,872 A | 5/1997 | Naritake et al. ............. 365/227 |
| 5,636,163 A | 6/1997 | Furutani et al. ............. 365/233 |
| 5,636,173 A | 6/1997 | Schaefer ................ 365/230.03 |
| 5,636,174 A | 6/1997 | Rao ....................... 365/230.03 |
| 5,638,335 A | 6/1997 | Akiyama et al. ....... 365/230.03 |
| 5,646,904 A | 7/1997 | Ohno et al. ................. 365/233 |
| 5,652,530 A | 7/1997 | Ashuri ......................... 326/93 |
| 5,657,289 A | 8/1997 | Hush et al. ............ 365/230.05 |
| 5,657,481 A | 8/1997 | Farmwald et al. .......... 395/551 |
| 5,663,921 A | 9/1997 | Pascucci et al. ............. 365/233 |
| 5,666,313 A | 9/1997 | Ichiguchi .................... 365/195 |
| 5,666,322 A | 9/1997 | Conkle ....................... 365/233 |
| 5,668,763 A | 9/1997 | Fujioka et al. .............. 365/200 |
| 5,668,774 A | 9/1997 | Furatani ...................... 365/233 |
| 5,673,005 A | 9/1997 | Pricer ........................... 331/1 R |
| 5,675,274 A | 10/1997 | Kobayashi et al. ......... 327/158 |
| 5,675,588 A | 10/1997 | Maruyama et al. ......... 371/20.4 |
| 5,692,165 A | 11/1997 | Jeddeloh et al. ............. 395/551 |
| 5,694,065 A | 12/1997 | Hamasaki et al. .......... 327/108 |
| 5,708,611 A | 1/1998 | Iwamoto .................. 365/233 X |
| 5,712,580 A | 1/1998 | Baumgartner et al. ........ 327/12 |
| 5,712,883 A | 1/1998 | Miller et al. ................. 375/371 |
| 5,719,508 A | 2/1998 | Daly ........................... 327/12 |
| 5,737,342 A | 4/1998 | Ziperovich ................ 371/25.1 |
| 5,740,123 A | 4/1998 | Uchida ........................ 365/233 |
| 5,751,665 A | 5/1998 | Tanoi ......................... 368/120 |
| 5,764,092 A | 6/1998 | Wada et al. ................. 327/271 |
| 5,767,715 A | 6/1998 | Marquis et al. ............. 327/159 |
| 5,768,177 A | 6/1998 | Sakuragi ..................... 365/194 |
| 5,774,699 A | 6/1998 | Nagae ......................... 395/551 |
| 5,778,214 A | 7/1998 | Taya et al. .................. 395/551 |
| 5,781,499 A | 7/1998 | Koshikawa .................. 365/233 |
| 5,784,422 A | 7/1998 | Heermann ................... 375/355 |
| 5,789,947 A | 8/1998 | Sato ............................. 327/3 |
| 5,790,612 A | 8/1998 | Chengson et al. .......... 375/373 |
| 5,794,020 A | 8/1998 | Tanaka et al. .............. 395/552 |
| 5,805,931 A | 9/1998 | Morzano et al. ............ 395/884 |
| 5,812,619 A | 9/1998 | Runaldue .................... 375/376 |
| 5,822,314 A | 10/1998 | Chater-Lea ................. 370/337 |
| 5,831,545 A | 11/1998 | Murray et al. ........ 340/825.49 |
| 5,831,929 A | 11/1998 | Manning ..................... 365/233 |
| 5,841,707 A | 11/1998 | Cline et al. ................. 365/194 |
| 5,852,378 A | 12/1998 | Keeth ......................... 327/171 |
| 5,872,959 A | 2/1999 | Nguyen et al. .............. 395/551 |
| 5,889,829 A | 3/1999 | Chiao et al. ................. 375/376 |
| 5,898,242 A | 4/1999 | Peterson ...................... 327/278 |
| 5,898,674 A | 4/1999 | Mawhinney et al. ........ 370/247 |
| 5,917,760 A | 6/1999 | Millar ......................... 365/194 |
| 5,920,518 A | 7/1999 | Harrison et al. ............. 365/233 |
| 5,926,047 A | 7/1999 | Harrison ...................... 327/159 |
| 5,926,436 A | 7/1999 | Toda et al. .................. 365/236 |
| 5,940,608 A | 8/1999 | Manning ..................... 395/551 |
| 5,940,609 A | 8/1999 | Harrison ..................... 395/559 |
| 5,945,855 A | 8/1999 | Momtaz ...................... 327/157 |
| 5,946,244 A | 8/1999 | Manning ..................... 365/194 |
| 5,953,284 A | 9/1999 | Baker et al. ................. 365/233 |
| 5,953,386 A | 9/1999 | Anderson .................... 375/376 |
| 5,964,884 A | 10/1999 | Partovi et al. ............... 713/503 |
| 5,990,719 A | 11/1999 | Dai et al. .................... 327/244 |
| 6,005,694 A | 12/1999 | Liu ............................. 359/110 |
| 6,005,823 A | 12/1999 | Martin et al. .......... 365/230.08 |
| 6,011,732 A | 1/2000 | Harrison et al. ............. 365/194 |
| 6,014,042 A | 1/2000 | Nguyen .......................... 327/3 |
| 6,016,282 A | 1/2000 | Keeth .......................... 365/233 |
| 6,021,268 A | 2/2000 | Johnson .................. 395/500.24 |
| 6,023,489 A | 2/2000 | Hatch .......................... 375/208 |
| 6,026,050 A | 2/2000 | Baker et al. ................. 635/233 |
| 6,026,134 A | 2/2000 | Duffy et al. ................. 375/376 |
| 6,029,250 A | 2/2000 | Keeth .......................... 713/400 |
| 6,038,219 A | 3/2000 | Mawhinney et al. ........ 370/242 |
| 6,067,592 A | 5/2000 | Farmwald et al. .......... 710/104 |
| 6,072,802 A * | 6/2000 | Uhm et al. ................... 370/441 |
| 6,087,857 A | 7/2000 | Wang ............................. 327/5 |
| 6,101,152 A | 8/2000 | Farmwald et al. .......... 365/233 |
| 6,101,197 A | 8/2000 | Keeth et al. ................. 370/517 |
| 6,105,157 A | 8/2000 | Miller ......................... 714/744 |
| 6,115,318 A | 9/2000 | Keeth .......................... 365/233 |
| 6,119,242 A | 9/2000 | Harrison ...................... 713/503 |
| 6,125,157 A | 9/2000 | Donnelly et al. ............ 375/371 |
| 6,147,905 A | 11/2000 | Seino ..................... 365/185.11 |
| 6,147,916 A | 11/2000 | Ogura ......................... 365/203 |
| 6,160,423 A | 12/2000 | Haq .............................. 327/41 |
| 6,173,432 B1 | 1/2001 | Harrison ......................... 716/1 |
| 6,253,360 B1 | 6/2001 | Yoshiba ......................... 716/6 |
| 6,262,921 B1 | 7/2001 | Manning .................... 365/194 |
| 6,269,451 B1 | 7/2001 | Mullarkey ................... 713/401 |
| 6,285,726 B1 | 9/2001 | Gaudet ........................ 375/376 |
| 6,295,328 B1 | 9/2001 | Kim et al. .................... 375/376 |
| 6,298,450 B1 | 10/2001 | Liu et al. ..................... 713/502 |
| 6,327,196 B1 | 12/2001 | Mullarkey ................... 365/194 |
| 6,327,318 B1 | 12/2001 | Bhullar et al. ............... 375/374 |
| 6,338,127 B1 | 1/2002 | Manning ..................... 711/167 |
| 6,377,646 B1 | 4/2002 | Sha ............................. 375/376 |
| 6,378,079 B1 | 4/2002 | Mullarkey ................... 713/401 |
| 6,438,043 B1 | 8/2002 | Gans et al. ................... 365/194 |
| 6,442,644 B1 | 8/2002 | Gustavson et al. .......... 711/105 |
| 6,484,244 B1 | 11/2002 | Manning ..................... 711/154 |
| 6,499,111 B1 | 12/2002 | Mullarkey ................... 713/401 |
| 6,665,222 B1 | 12/2003 | Wright et al. ............... 365/203 |

FOREIGN PATENT DOCUMENTS

| | | |
|---|---|---|
| EP | 0 295 515 A1 | 12/1988 |
| EP | 0 406 786 A1 | 1/1991 |
| EP | 0 450 871 A2 | 10/1991 |
| EP | 0 476 585 A3 | 3/1992 |
| EP | 0 655 741 A2 | 5/1995 |
| EP | 0 655 834 A1 | 5/1995 |
| EP | 0 680 049 A2 | 11/1995 |
| EP | 0 703 663 A1 | 3/1996 |
| EP | 0 704 848 A3 | 4/1996 |
| EP | 0 704 975 A1 | 4/1996 |
| EP | 0 767 538 A1 | 4/1997 |
| JP | 6-1237512 | 10/1986 |
| JP | 2-112317 | 4/1990 |
| JP | 4-135311 | 5/1992 |
| JP | 5-136664 | 6/1993 |
| JP | 5-282868 | 10/1993 |
| JP | 0-7319577 | 12/1995 |
| WO | WO 94/29871 | 12/1994 |
| WO | WO 95/22200 | 8/1995 |
| WO | WO 95/22206 | 8/1995 |
| WO | WO 96/10866 | 4/1996 |
| WO | WO 97/14289 | 4/1997 |
| WO | WO 97/42557 | 11/1997 |

OTHER PUBLICATIONS

Anonymous, "400MHz SLDRAM, 4M X 16 SLDRAM Pipelined, Eight Bank, 2.5 V Operation," SLDRAM Consortium Advance Sheet, published throughout the United States, pp. 1-22.

Anonymous, "Draft Standard for a High-Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1-56.

Anonymous, "Programmable Pulse Generator", IBM Technical Disclosure Bulletin, vol. 17, No. 12, May 1975, pp. 3553-3554.

Arai, Y. et al., "A Time Digitizer CMOS Gate-Array with a 250 ps Time Resolution", XP 000597207, IEEE Journal of Solid-State Circuits, vol. 31, No. 2, Feb. 1996, pp. 212-220.

Anonymous, "Pulse Combining Network", IBM Technical Disclosure Bulletin, vol. 32, No. 12, May 1990, pp. 149-151.

Anonymous, "Variable Delay Digital Circuit", IBM Technical Disclosure Bulletin, vol. 35, No. 4A, Sep. 1992, pp. 365-366.

Arai, Y. et al., "A CMOS Four Channel x 1K Time Memory LSI with 1-ns/b Resolution", IEEE Journal of Solid-State Circuits, vol. 27, No. 3, M, 8107 Mar. 1992, No. 3, New York, US, pp. 359-364 and pp. 528-531.

Aviram, A. et al., "Obtaining High Speed Printing on Thermal Sensitive Special Paper with a Resistive Ribbon Print Head", IBM Technical Disclosure Bulletin, vol. 27, No. 5, Oct. 1984, pp. 3059-3060.

Bazes, M., "Two Novel Fully Complementary Self-Biased CMOS Differential Amplifiers", IEEE Journal of Solid-State Circuits, vol. 26, No. 2, Feb. 1991, pp. 165-168.

Chapman, J. et al., "A Low-Cost High-Performance CMOS Timing Vernier for ATE", IEEE International Test Conference, Paper 21.2, 1995, pp. 459-468.

Cho, J. "Digitally-Controlled PLL with Pulse Width Detection Mechanism for Error Correction", ISSCC 1997, Paper No. SA 20.3, pp. 334-335.

Christiansen, J., "An Integrated High Resolution CMOS Timing Generator Based on an Array of Delay Locked Loops", IEEE Journal of Solid-State Circuits, vol. 31, No. 7, Jul. 1996, pp. 952-957.

Combes, M. et al., "A Portable Clock Multiplier Generator Using Digital CMOS Standard Cells", IEEE Journal of Solid-State Circuits, vol. 31, No. 7, Jul. 1996, pp. 958-965.

Donnelly, K. et al., "A 660 MB/s Interface Megacell Portable Circuit in 0.3 µm-0.7 µm CMOS ASIC", IEEE Journal of Solid-State Circuits, vol. 31, No. 12, Dec. 1996, pp. 1995-2001.

Goto, J. et al., "A PLL-Based Programmable Clock Generator with 50- to 350-MHz Oscillating Range for Video Signal Processors", IEICE Trans. Electron., vol. E77-C, No. 12, Dec. 1994, pp. 1951-1956.

Gustavsion, David B., et al., "IEEE Standard for Scalable Coherent Interface (SCI)," IEEE Computer Society, IEEE Std. 1596-1992, Aug. 2, 1993.

Hamamoto, T., "400-MHz Random Column Operating SDRAM Techniques with Self-Skew Compensation", IEEE Journal of Solid-State Circuits, vol. 33, No. 5, May 1998, pp. 770-778.

Ishibashi, A. et al., "High-Speed Clock Distribution Architecture Employing PLL for 0.6µm CMOS SOG", IEEE Custom Integrated Circuits Conference, 1992, pp. 27.6.1-27.6.4.

Kim, B. et al., "A 30MHz High-Speed Analog/Digital PLL in 2µm CMOS", ISSCC, Feb. 1990.

Kikuchi, S. et al., "A Gate-Array-Based 666MHz VLSI Test System", IEEE International Test Conference, Paper 21.1, 1995, pp. 451-458.

Ko, U. et al., "A 30-ps JITTER, 3.6-µs Locking, 3.3-Volt Digital PLL for CMOS Gate Arrays", IEEE Custom Integrated Circuits Conference, 1993, pp. 23.3.1-23.3.4.

Lee, T. et al., "A 2.5V Delay-Locked Loop for an 18Mb 500MB/s DRAM", IEEE International Solid-State Circuits Conference Digest of Technical Papers, Paper No. FA 18.6, 1994, pp. 300-301.

Lesmeister, G., "A Densely Integrated High Performance CMOS Tester", International Test Conference, Paper 16.2, 1991, pp. 426-429.

Ljuslin, C. et al., "An Integrated 16-channel CMOS Time to Digital Converter", IEEE Nuclear Science Symposium & Medical Imaging Conference Record, vol. 1, 1993, pp. 625-629.

Maneatis, J., "Low-Jitter Process-Independent DLL and PLL Based on Self-Biased Techniques", IEEE Journal of Solid-State Circuits, vol. 31, No. 11, Nov. 1996, pp. 1723-1732.

Nakamura, M. et al., "A 156 Mbps CMOS Clock Recovery Circuit for Burst-mode Transmission", Symposium on VLSI Circuits Digest of Technical Papers, 1996, pp. 122-123.

Nielson, E., "Inverting latches make simple VCO", EDN, Jun. 19, 1997.

Novof, I. et al., "Fully Integrated CMOS Phase-Locked Loop with 15 to 240 MHz Locking Range and ±50 ps Jitter", IEEE Journal of Solid-State Circuits, vol. 30, No. 11, Nov. 1995, pp. 1259-1266.

Saeki, T. et al., "A 2.5-ns Clock Access, 250-MHz, 256-Mb SDRAM with Synchronous Mirror Delay", IEEE Journal of Solid-State Circuits, vol. 31, No. 11, Nov. 1996, pp. 1656-1665.

Santos, D. et al., "A CMOS Delay Locked Loop And Sub-Nanosecond Time-to-Digital Converter Chip", IEEE Nuclear Science Symposium and Medical Imaging Conference Record, vol. 1, Oct. 1995, pp. 289-291.

Shirotori, T. et al., "PLL-based, Impedance Controlled Output Buffer", 1991 Symposium on VLSI Circuits Digest of Technical Papers, pp. 49-50.

Sidiropoulos, S. et al., "A 700-Mb/s/pin CMOS Signaling Interface Using Current Integrating Receivers", IEEE Journal of Solid-State Circuits, vol. 32, No. 5, May 1997, pp. 681-690.

Sidiropoulos, S. et al., "A CMOS 500 Mbps/pin synchronous point to point link interface", IEEE Symposium on VLSI Circuits Digest of Technical Papers, 1994, pp. 43-44.

Sidiropoulos, S. et al., "A Semi-Digital DLL with Unlimited Phase Shift Capability and 0.08-400MHz Operating Range," IEEE International Solid State Circuits Conference, Feb. 8, 1997, pp. 332-333.

Soyuer, M. et al., "A Fully Monolithic 1.25GHz CMOS Frequency Synthesizer", IEEE Symposium on VLSI Circuits Digest of Technical Papers, 1994, pp. 127-128.

Taguchi, M. et al., "A 40-ns 64-Mb DRAM with 64-b Parallel Data Bus Architecture", IEEE Journal of Solid-State Circuits, vol. 26, No. 11, Nov. 1991, pp. 1493-1497.

Tanoi, S. et al., "A 250-622 MHz Deskew and Jitter-Suppressed Clock Buffer Using a Frequency- and Delay-Locked Two-Loop Architecture", 1995 Symposium on VLSI Circuits Digest of Technical Papers, vol. 11, No. 2, pp. 85-86.

Tanoi, S. et. al., "A 250-622 MHz Deskew and Jitter-Suppressed Clock Buffer Using Two-Loop Architecture", IEEE IEICE Trans. Electron., vol. E-79-C. No. 7, Jul. 1996, pp. 898-904.

von Kaenel, V. et al., "A 320 MHz, 1.5 mW @ 1.35 V CMOS PLL for Microprocessor Clock Generation", IEEE Journal of Solid-State Circuits, vol. 31, No. 11, Nov. 1996, pp. 1715-1722.

Watson, R. et al., "Clock Buffer Chip with Absolute Delay Regulation Over Process and Environmental Variations", IEEE Custom Integrated Circuits Conference, 1992, pp. 25.2.1-25.2.5.

Yoshimura, T. et al. "A 622-Mb/s Bit/Frame Synchronizer for High-Speed Backplane Data Communication", IEEE Journal of Solid-State Circuits, vol. 31, No. 7, Jul. 1996, pp. 1063-1066.

Park, D. et al., "Fast Acquisition Frequency Synthesizer with the Multiple Phase Detectors", IEEE Pacific Rim Conference on Communications, Computers and Signal Processing, vol. 2, May 1991. pp. 665-668.

* cited by examiner

METHOD AND APPARATUS FOR GENERATING EXPECT DATA FROM A CAPTURED BIT PATTERN, AND MEMORY DEVICE USING SAME

CROSS-REFERENCE TO RELATED APPLICATIONS

This application is a continuation of U.S. patent application Ser. No. 10/268,351, filed Oct. 9, 2002 now U.S. Pat. No. 6,647,523, which is a continuation of U.S. patent application Ser. No. 09/924,139, filed Aug. 7, 2001, issued Nov. 5, 2002 as U.S. Pat. No. 6,477,675 B2, which is a divisional of U.S. patent application Ser. No. 09/146,860, filed Sep. 3, 1998, issued Feb. 19, 2002 as Pat. No. 6,349,399 B1.

TECHNICAL FIELD

The present invention relates generally to integrated circuit devices, and more particularly to a method and circuit utilizing a first captured bit stream in generating expect data for subsequent captured bit streams.

BACKGROUND OF THE INVENTION

A conventional computer system includes a processor coupled to a variety of memory devices, including read-only memories ("ROMs") which traditionally store instructions for the processor, and a system memory to which the processor may write data and from which the processor may read data. The system memory generally includes dynamic random access memory ("DRAM"), and in many modern computer systems includes synchronous DRAMs ("SDRAMs") to enable the processor to access data at increasingly faster rates. One skilled in the art will appreciate, however, that a large speed disparity subsists between the operating speed of modern processors and that of modern SDRAMs. This speed disparity limits the rate at which the processor can access data stored in the SDRAMs, which is a common operation, and consequently limits the overall performance of the computer system. For example, modern processors, such as the Pentium® and Pentium II® microprocessors, are currently available operating at clock speeds of at least 400 MHz, while many SDRAMs operate at a clock speed of 66 MHz, which is a typical clock frequency for controlling system memory devices.

A solution to this operating speed disparity has been proposed in the form of a computer architecture known as a synchronous link architecture. In the synchronous link architecture, the system memory devices operate at much higher speeds and may be coupled to the processor either directly through the processor bus or through a memory controller. Rather than requiring that separate address and control signals be provided to the system memory, synchronous link memory devices receive command packets that include both control and address information. The synchronous link memory device then outputs or receives data on a data bus that may be coupled directly to the data bus portion of the processor bus.

A typical synchronous link dynamic random access memory ("SLDRAM") memory device 16 is shown in block diagram form in FIG. 1. The memory device 16 includes a clock generator circuit 40 that receives a command clock signal CCLK and generates a large number of other clock and timing signals to control the timing of various operations in the memory device 16. The memory device 16 also includes a command buffer 46 and an address capture circuit 48 which receive an internal clock signal ICLK, a command packet CA<0:39> in the form of 4 packet words CA<0:9> applied sequentially on a 10 bit command-address bus CA, and a terminal 52 receiving a FLAG signal. A synchronization circuit 49 is part of the command buffer 46, and operates during a synchronization mode to synchronize the command clock signal CCLK and two data clock signals DCLK0 and DCKL1, as will be explained in more detail below.

A memory controller (not shown) or other device normally transmits the command packet CA<0:39> to the memory device 16 in synchronism with the command clock signal CCLK. The command packet CA<0:39> contains control and address information for each memory transfer. The FLAG signal identifies the start of a command packet CA<0:39>, and also signals the start of an synchronization sequence. The command buffer 46 receives the command packet CA<0:39> from the command-address bus CA, and compares at least a portion of the command packet to identifying data from an ID register 56 to determine if the command packet is directed to the memory device 16 or some other memory device (not shown). If the command buffer 46 determines that the command is directed to the memory device 16, it then provides the command to a command decoder and sequencer 60. The command decoder and sequencer 60 generates a large number of internal control signals to control the operation of the memory device 16 during a memory transfer.

The address capture circuit 48 also receives the command packet from the command-address bus CA and outputs a 20-bit address corresponding to the address information in the command packet. The address is provided to an address sequencer 64, which generates a corresponding 3-bit bank address on bus 66, a 10-bit row address on bus 68, and a 7-bit column address on bus 70. The row and column addresses are processed by row and column address paths, as will be described in more detail below.

One of the problems of conventional DRAMs is their relatively low speed resulting from the time required to precharge and equilibrate circuitry in the DRAM array. The memory device 16 largely avoids this problem by using a plurality of memory banks 80, in this case eight memory banks 80a–h. After a read from one bank 80a, the bank 80a can be precharged while the remaining banks 80b–h are being accessed. Each of the memory banks 80a–h receives a row address from a respective row latch/decoder/driver 82a–h. All of the row latch/decoder/drivers 82a–h receive the same row address from a predecoder 84 which, in turn, receives a row address from either a row address register 86 or a refresh counter 88 as determined by a multiplexer 90. However, only one of the row latch/decoder/drivers 82a–h is active at any one time as determined by bank control logic 94 as a function of a bank address from a bank address register 96.

The column address on bus 70 is applied to a column latch/decoder 100, which supplies I/O gating signals to an I/O gating circuit 102. The I/O gating circuit 102 interfaces with columns of the memory banks 80a–h through sense amplifiers 104. Data is coupled to or from the memory banks 80a–h through the sense amps 104 and I/O gating circuit 102 to a data path subsystem 108 which includes a read data path 110 and a write data path 112. The read data path 110 includes a read latch 120 that stores data from the I/O gating circuit 102. In the memory device 16, 64 bits of data, which is designated a data packet, are stored in the read latch 120. The read latch then provides four 16-bit data words to an output multiplexer 122 that sequentially supplies each of the 16-bit data words to a read FIFO buffer 124. Successive 16-bit data words are clocked into the read FIFO buffer 124 by a clock signal RCLK generated from the internal clock signal ICLK. The 16-bit data words are then clocked out of the read FIFO buffer 124 by a clock signal obtained by coupling the RCLK signal through a programmable delay circuit 126. The programmable delay circuit 126 is programmed during synchronization of the memory device 16 so that the data from the memory device is received by a memory controller, processor, or other device (not shown) at the proper time. The FIFO buffer 124 sequentially applies the 16-bit data words to a driver circuit 128 which, in turn, applies the 16-bit data words to a data bus DQ. The driver circuit 128 also applies one of two data clock signals DCLK0 and DCLK1 to respective data clock lines 132 and 133. The data clocks DCLK0 and DCLK1 enable a device, such as a processor, reading the data on the data bus DQ to be synchronized with the data. Particular bits in the command portion of the command packet CA<0:39> determine which of the two data clocks DCLK0 and DCLK1 is applied by the driver circuit 128. It should be noted that the data clocks DCLK0 and DCLK1 are differential clock signals, each including true and complementary signals, but for ease of explanation, only one signal for each clock is illustrated and described.

The write data path 112 includes a receiver buffer 140 coupled to the data bus 130. The receiver buffer 140 sequentially applies 16-bit data words from the data bus DQ to four input registers 142, each of which is selectively enabled by a signal from a clock generator circuit 144. The clock generator circuit 144 generates these enable signals responsive to the selected one of the data clock signals DCLK0 and DCLK1. The memory controller or processor determines which data clock DCLK0 or DCLK1 will be utilized during a write operation using the command portion of a command packet applied to the memory device 16. As with the command clock signal CCLK and command packet CA<0:39>, the memory controller or other device (not shown) normally transmits the data to the memory device 16 in synchronism with the selected one of the data clock signals DCLK0 and DCLK1. The clock generator 144 is programmed during synchronization to adjust the timing of the clock signal applied to the input registers 142 relative to the selected one of the data clock signals DCLK0 and DCLK1 so that the input registers 142 can capture the write data at the proper times. In response to the selected data clock DCLK0 or DCLK1, the input registers 142 sequentially store four 16-bit data words and combine them into one 64-bit write packet data applied to a write FIFO buffer 148. The write FIFO buffer 148 is clocked by a signal from the clock generator 144 and an internal write clock WCLK to sequentially apply 64-bit write data to a write latch and driver 150. The write latch and driver 150 applies the 64-bit write data packet to one of the memory banks 80*a*–*h* through the I/O gating circuit 102 and the sense amplifiers 104.

A typical command packet CA<0:39> for the SLDRAM 16 is shown in FIG. 2 and is formed by 4 packet words CA<0:9>, each of which contains 10 bits of data. As explained above, each 10-bit packet word CA<0:9> is applied on the command-address bus CA including the 10 lines CA0–CA9, and coincident with each packet word CA<0:9> a FLAG bit is applied on the FLAG line 52. As previously discussed, during normal operation the FLAG bit is high to signal the start of a command packet CA<0:39>, and thus is only high coincident with the first packet word CA<0:9> of the command packet. In FIG. 2, the four packet words CA<0:9> comprising a command packet CA<0:39> are designated PW1–PW4. The first packet word $PW_1$ contains 7 bits of data identifying the memory device 16 that is the intended recipient of the command packet. The memory device 16 has a unique ID code stored in the ID register 56, and this code is compared to the 7 ID bits in the first packet word $PW_1$. Thus, although all of the memory devices 16 in a synchronous link system will receive the command packet CA<0:39>, only the memory device 16 having an ID code that matches the 7 ID bits of the first packet word $PW_1$ will respond to the command packet.

The remaining 3 bits of the first packet word $PW_1$ as well as 3 bits of the second packet word $PW_2$ comprise a 6 bit command. Typical commands are read and write in a variety of modes, such as accesses to pages or banks of memory cells. The remaining 7 bits of the second packet word $PW_2$ and portions of the third and fourth packet words $PW_3$ and $PW_4$ comprise a 20 bit address specifying a bank, row and column address for a memory transfer or the start of a multiple bit memory transfer. In one embodiment, the 20-bit address is divided into 3 bits of bank address, 10 bits of row address, and 7 bits of column address. Although the command packet CA<0:39> shown in FIG. 2 is composed of 4 packet words PW1–PW4 each containing up to 10 bits, it will be understood that a command packet may contain a lesser or greater number of packet words, and each packet word may contain a lesser or greater number of bits.

As mentioned above, an important goal of the synchronous link architecture is to allow data transfer between a processor and a memory device to occur at a significantly faster rate. However, as the rate of data transfer increases, it becomes more difficult to maintain synchronization between signals transmitted to the memory device 16. For example, as mentioned above, the command packet CA<0:39> is normally transmitted to the memory device 16 in synchronism with the command clock signal CCLK, and the data is normally transmitted to the memory device 16 in synchronism with the selected one of the data clock signals DCLK0 and DCLK1. However, because of unequal signal delays and other factors, the command packet CA<0:39> may not arrive at the memory device 16 in synchronism with the command clock signal CCLK, and the data may not arrive at the memory device 16 in synchronism with the selected data clock signal DCLK0 or DCLK1. Moreover, even if these signals are actually coupled to the memory device 16 in synchronism with each other, they may loose synchronism once they are coupled to circuits within the memory device. For example, internal signals require time to propagate to various circuitry in the memory device 16, differences in the lengths of signal routes can cause differences in the times at which signals reach the circuitry, and differences in capacitive loading of signal lines can also cause differences in the times at which signals reach the circuitry. These differences in arrival times can become significant at high speeds of operation and eventually limit the operating speed of memory devices.

The problems associated with varying arrival times are exacerbated as timing tolerances become more restricted with higher data transfer rates. For example, if the internal clock ICLK derived from the command clock CCLK does not latch each of the packet words CA<0:9> comprising a command packet CA<0:39> at the proper time, errors in the operation of the memory device may -result. Similarly, data errors may result if internal signals developed responsive to the data clocks DCLK0 and DCLK1 do not latch data applied on the data bus DQ at the proper time. Thus, the command clock CCLK and data clocks DCLK0 and DCLK1 must be synchronized to ensure proper operation of the SLDRAM 16. One skilled in the art will understand that when synchronization of the clock signals CCLK, DCLK0, and DCLK1 is discussed, this means the adjusting of the timing of respective internal clock signals derived from these respective external clock signals so the internal clock signals can be used to latch corresponding digital signals at optimum times. For example, the command clock signal CCLK is synchronized when the timing of the internal clock signal ICLK relative to the command clock signal CCLK causes packet words CA<0:9> to be latched at the optimum time.

To synchronize the clock signals CCLK, DCLK0, and DCLK1, the memory controller (not shown) places the memory device 16 in a synchronization mode by applying a 15 bit repeating pseudo-random bit sequence on each line of the command-address bus CA, data bus DQ, and on the FLAG line 52. One of the 15 bit pseudo-random bit sequences that may be applied is shown below in Table 1:

TABLE 1

| FLAG | 1 | 1 | 1 | 1 | 0 | 1 | 0 | 1 | 1 | 0 | 0 | 1 | 0 | 0 | 0 |
|---|---|---|---|---|---|---|---|---|---|---|---|---|---|---|---|
| CA<9> | 0 | 0 | 0 | 0 | 1 | 0 | 1 | 0 | 0 | 1 | 1 | 0 | 1 | 1 | 1 |
| CA<8> | 1 | 1 | 1 | 1 | 0 | 1 | 0 | 1 | 1 | 0 | 0 | 1 | 0 | 0 | 0 |
| CA<7> | 0 | 0 | 0 | 0 | 1 | 0 | 1 | 0 | 0 | 1 | 1 | 0 | 1 | 1 | 1 |
| M | M | M | M | M | M | M | M | M | M | M | M | M | M | M | M |
| CA<0> | 1 | 1 | 1 | 1 | 0 | 1 | 0 | 1 | 1 | 0 | 0 | 1 | 0 | 0 | 0 |
| DQ<15> | 0 | 0 | 0 | 0 | 1 | 0 | 1 | 0 | 0 | 1 | 1 | 0 | 1 | 1 | 1 |
| DQ<14> | 1 | 1 | 1 | 1 | 0 | 1 | 0 | 1 | 1 | 0 | 0 | 1 | 0 | 0 | 0 |
| M | M | M | M | M | M | M | M | M | M | M | M | M | M | M | M |
| DQ<0> | 1 | 1 | 1 | 1 | 0 | 1 | 0 | 1 | 1 | 0 | 0 | 1 | 0 | 0 | 0 |

As seen in Table 1, the 15-bit pseudo-random bit sequence is complemented on adjacent lines of the command-address bus CA and data bus DQ. In the following description, only the synchronization of the ICLK signal will be described, so only the bit sequences applied on the command-address bus CA and FLAG line 52, which are latched in response to the ICLK signal, will be discussed. Furthermore, the bit sequences applied on the command-address bus CA and FLAG line 52 may alternatively be referred to as bit streams in the following discussion. However, the DCLK0 and DCLK1 signals are synchronized in essentially the same manner.

The memory device 16 captures the bits applied on the lines CA0–CA9 and the FLAG line 52 in response to the ICLK signal, and the synchronization circuit 49 places the memory device 16 in the synchronization mode when it detects two consecutive high (i.e., two 1's) on the FLAG bit. Recall, during normal operation, only a single high FLAG bit is applied coincident with the first packet word CA<0:9> of the command packet CA<0:39>. After the synchronization circuit 49 places the SLDRAM 16 in the synchronization mode, the SLDRAM 16 continues capturing packet words CA<0:9> applied on the bus CA and the coincident applied FLAG bits in response to the ICLK signal. After four packet words CA<0:9> and the accompanying four FLAG bits have been captured, the synchronization circuit 49 compares the captured bits to their expected values. The synchronization circuit 49 determines the expected values from the known values of the 15 bit repeating pseudo-random bit sequence. For example, from Table 1, after the first four bits 1111 of the FLAG bit are captured, the circuit 49 calculates the expected data for the next four captured bits as 0101, and the next four as 1001, and so on. In operation, the synchronization circuit 49 adjusts the phase of the ICLK signal before capturing the next group of bits. For example, a first phase for the ICLK signal is used to capture the first four FLAG bits 1111, a second phase for the FLAG bits 0101, a third phase for the FLAG bits 1001, and so on. Each phase resulting in successful capture of the command packet CA<0:39> is recorded by the synchronization circuit 49, and thereafter one of these phases is selected to be utilized during normal operation of the memory device 16.

FIG. 3 illustrates a potential problem encountered when synchronizing the memory device 16 as described above. In FIG. 3, the 15-bit pseudo-random bit pattern applied for the FLAG bit is shown by way of example, but the same potential problem exists for the bit sequences on the lines CA0–CA9 as well. The top sequence is the actual bit pattern applied for the FLAG bit, with the bits arranged in groups of 4 in respective capture groups C1–C15. Each capture group C1–C15 corresponds to the four FLAG bits captured coincident with four corresponding packet words CA<0:9>. The capture group C1 corresponds to the start of the bit sequence, and, as should be noted, the two consecutive ones for the FLAG bit place the memory device 16 in the synchronization mode. Ideally, the SLDRAM 16 captures the first group C1 of 4 FLAG bits 1111, then the group C2 of 0101, then group C3 of 1001, and so on. During ideal operation, the capture group C1 of 1111 is captured first, placing the memory device 16 in synchronization mode, and thereafter, the synchronization circuit 49 (FIG. 1) provides the expected data for the subsequent capture groups C2-CN. In other words, the synchronization circuit 49 expects the captured FLAG bits for C2 to equal 0101, for C3 to equal 1001, and so on.

If the capturing of the FLAG bit sequence is shifted, however, as shown in the lower bit sequence of FIG. 3, the synchronization circuit 49 may use the improper expect data for capture groups C2–C15. For example, assume the actual bits captured for groups C1–C5 are as shown in the lower bit sequence of FIG. 3. In response to the bits 1101 captured for group C1, the memory device 16 enters the synchronization mode of operation due to the two high FLAG bits. After this, the synchronization circuit 49 expects group C2 bits to equal 0101, group C3 bits to equal 1001, and so on for groups C4–C15 as indicated by the ideal FLAG data shown in the top bit sequence. Instead, however, the group C2 bits equal 0110 for the shifted FLAG sequence, and the group C3 equals 0100, and so on, such that each of the respective capture groups C1-C15 in the shifted FLAG bit sequence corresponds to four bits in the top bit sequence shifted to the left by two bits, as indicated by dotted lines 30. This could occur, for example, when the memory device 16 fails to latch the first two ones applied on the FLAG line 52 due to delays in CCLK signal applied by the controller. When the FLAG bit sequence is shifted, the values of subsequent capture groups result in the synchronization circuit 49 determining the FLAG bit is not being correctly captured, when in fact the FLAG bit pattern is being successfully captured but is merely shifted by a random number of bits.

There is a need for generating accurate expect data when capturing a pseudo-random bit sequence during synchronization of packetized memory device. In addition, it should be noted that while the above discussion is directed towards packetized memory devices such as SLDRAMs, the concepts apply to other types of integrated circuits as well, including other types of memory devices and communications circuits.

SUMMARY OF THE INVENTION

According to one aspect of the present invention, expect data signals are generated for a series of applied data signals having a known sequence to determine if groups of these applied data signals have been properly captured. A method according to one embodiment of the present invention captures a first group of the applied data signals, and generates a group of expect data signals from the captured first group of applied data signals. A second group of the applied data signals are then captured after the first group. The second group of applied data signals are determined to have been properly captured when the second captured group of applied data signals equals the group of expect data signals. In this way, when capture of the applied series of data signals is shifted in time from an expected initial capture point, subsequent captured groups of applied data signals are compared to their correct expected data signals in order to determine whether that group, although shifted in time, was nonetheless correctly captured.

According to another aspect of the present invention, the series of applied data signals comprises a 15-bit pseudo-random bit sequence of data signals. In one embodiment, this 15-bit pseudo-random bit sequence comprises the repeating bit sequence of '111101011001000,' and 4-bit groups of this repeating pseudo-random bit sequence are captured at a time. In this embodiment, the generated expect data signals represent all possible 4-bit combinations for the 15-bit pseudo-random bit sequence, these 15 possible 4-bit combinations being 1111, 0101, 1001, 0001, 1110, 1011, 0010, 0011, 1101, 0110, 0100, 0111, 1010, 1100, and 1000.

According to another aspect of the present invention, a packetized dynamic random access memory includes a pattern generator that generates expect data for a repeating bit sequence applied on external terminals of the memory and is utilized in synchronizing clock signals applied to the packetized dynamic random access memory. The pattern generator preferably comprises a register having a plurality of inputs and outputs, and a clock terminal adapted to receive a clock signal. The register shifts data applied on each of its inputs to a corresponding output responsive to the clock signals. A switch circuit has a plurality of first signal terminals coupled to receive latched digital signals from a latch which stores such signals in response to a transition of an internal clock signal. The switch circuit further includes a plurality of second signal terminals coupled to the corresponding inputs of the register, and a control terminal adapted to receive a seed signal. The switch circuit couples each first signal terminal to a corresponding second signal terminal responsive to the seed signal going active. A logic circuit is coupled between the register inputs and outputs, and has a terminal adapted to receive the seed signal. The logic circuit generates, when the seed signal is inactive, new expect data signals on its outputs responsive to current expect data signals provided on the register outputs. A synchronization circuit is coupled to the latch, a clock generator that generates the internal clock signal, and the pattern generator, and operates in combination with the circuits to synchronize the internal clock signal.

DETAILED DESCRIPTION OF THE INVENTION

Figure 4:
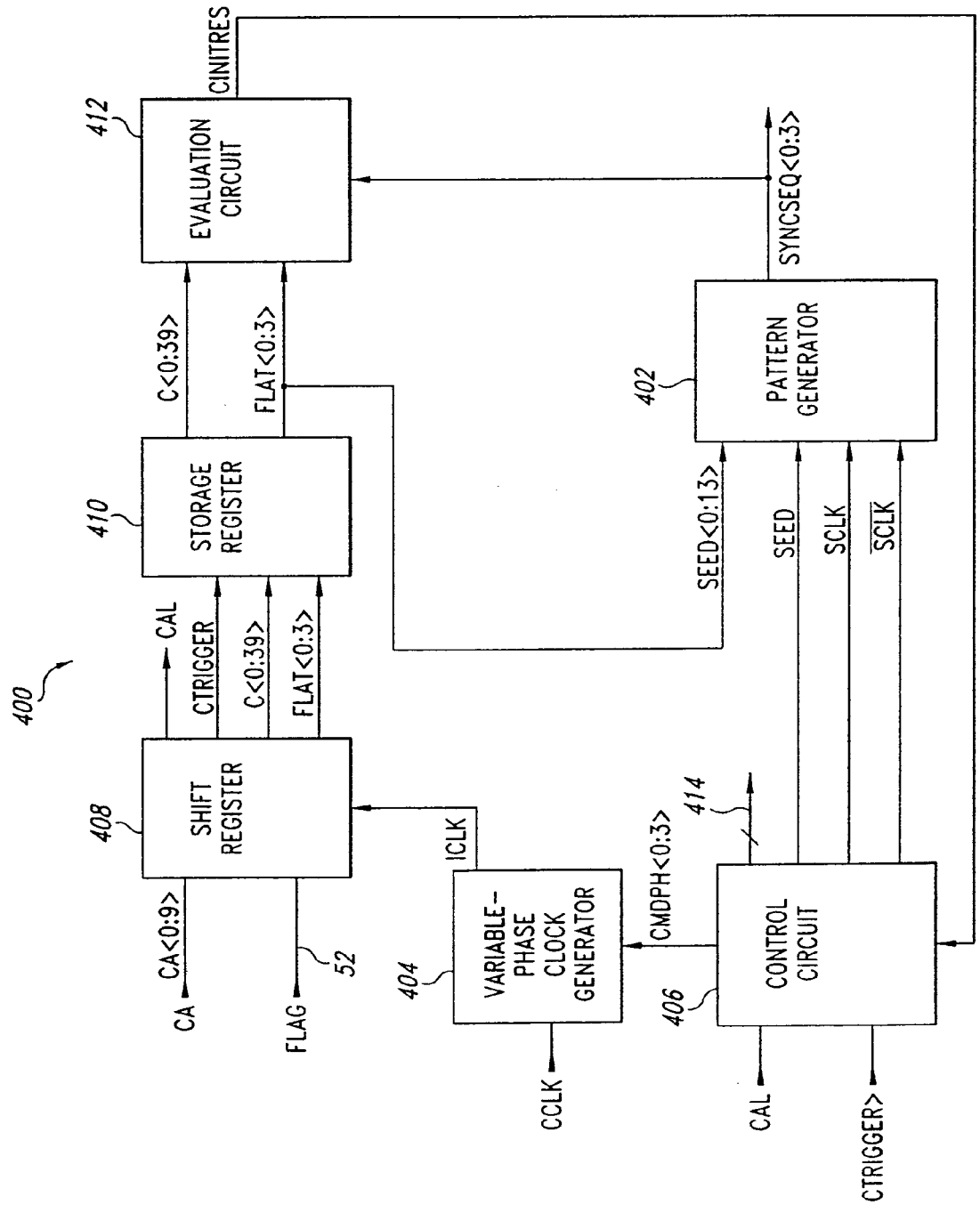
FIG. 4 is a functional block diagram of a synchronization circuit including a pattern generator according to one embodiment of the present invention.

FIG. 4 is a functional block diagram of a synchronization circuit 400 including a pattern generator 402 according to one embodiment of the present invention. Typically, the synchronization circuit 400 is contained in the command buffer 46, address capture circuit 50, and clock generation circuits 40, 144 of the SLDRAM 16 of FIG. 1, and operates during an initialization mode of the SLDRAM to synchronize the clock signals CCLK, DCLK0, and DCLK1, as will be explained in more detail below. During synchronization of the clock signals CCLK, CLK0, and DCLK1, the pattern generator 402 generates a sequence of expect data words in response to a sample or seed group of bits latched on one of the terminals of the SLDRAM, as will also be described in more detail below. Components and signals that were previously described with reference to FIG. 1 have been given the same reference numbers in FIG. 4, and will not be described in further detail.

In FIG. 4, only the components of the synchronization circuit 400 required for synchronizing the command clock signal CCLK are shown and will be described in further detail. As will be understood by one skilled in the art, however, the synchronization circuit 400 also includes analogous components for synchronizing the data clock signals DCLK0 and DCLK1. For example, referring back to FIG. 1, the input registers 142 latch data packets applied on the data bus DQ in response to clock signals generated by the clock generator 144 responsive to the selected one of the data clock signals DCLK0 and DCLK1, and these data packets latched by the register are then compared by a corresponding evaluation circuit or circuits (not shown) in the synchronization circuit 400.

Figure 1:
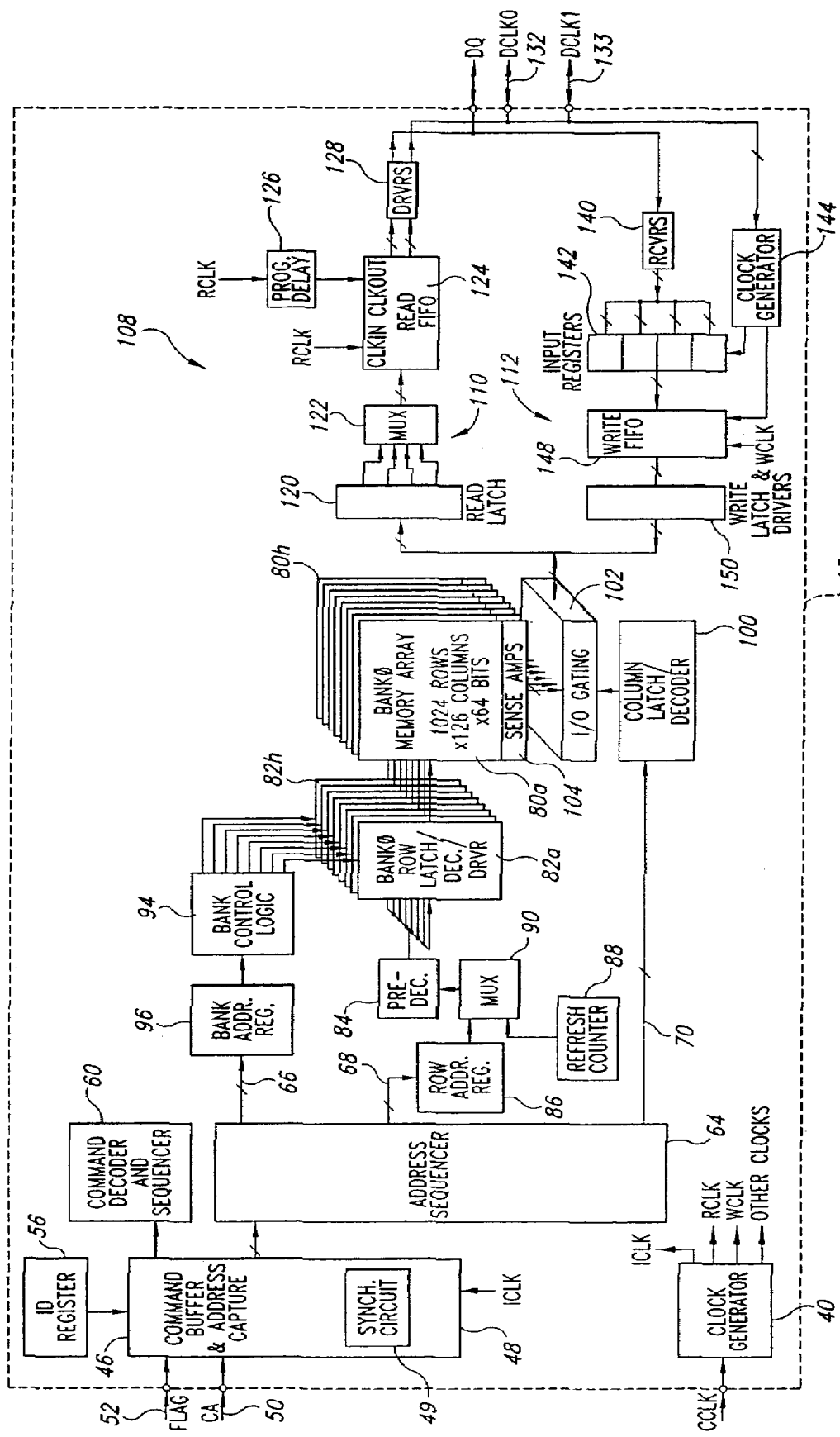
FIG. 1 is a functional block diagram of a conventional SLDRAM packetized memory device.
Figure 2:
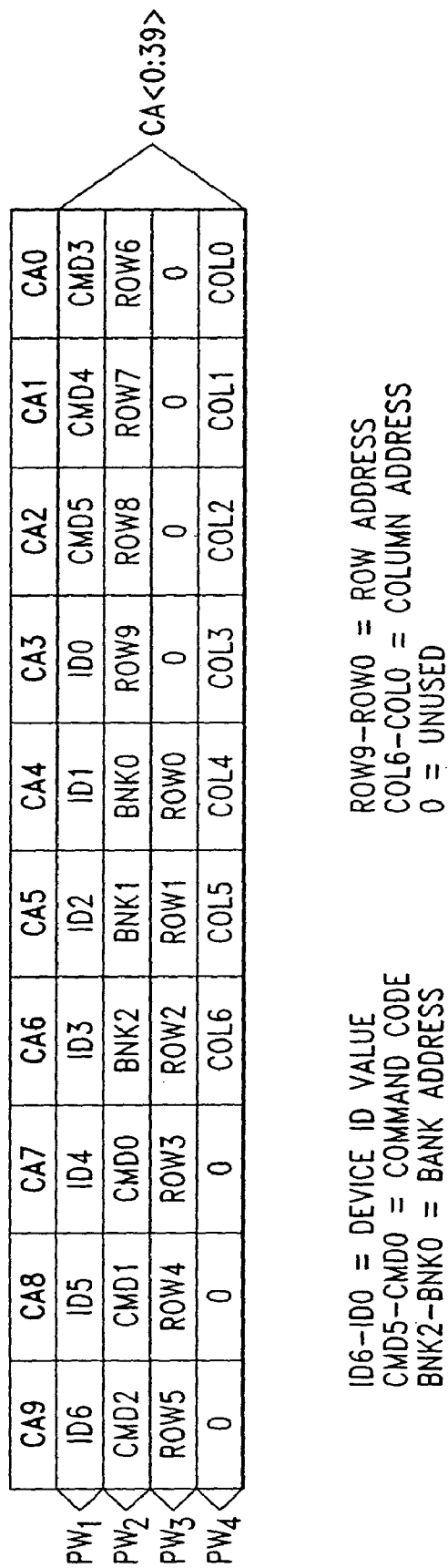
FIG. 2 is a table showing a typical command packet received by the SLDRAM of FIG. 1.

The synchronization circuit 400 includes a variable-phase clock generation circuit 404, which is part of the clock generation circuit 40 of FIG. 1, and generates the internal clock signal ICLK in response to the command clock signal CCLK. A more detailed description of one embodiment of the variable-phase clock generation circuit 404 is described in U.S. patent application Ser. No. 08/890,055 to Baker et al., which is incorporated herein by reference. The phase of the internal command clock signal ICLK relative to the command clock signal CCLK is controlled by a phase command word CMDPH<0:3> developed by a control circuit 406. During the synchronization procedure, the control circuit 406 applies a number of control signals 414 to control the operation of components of the synchronization circuit 400, and also determines an optimum value for the phase command word CMDPH<0:3>, as will be explained in more detail below.

The synchronization circuit 400 further includes a shift register 408 receiving command packets CA<0:39> applied on the command-address bus CA. The width of the command-address bus CA corresponds to the width of the shift register 408, and the number of packet words CA<0:9> in the command packet CA<0:39> corresponds to the number of stages of the shift register 408. In the embodiment of FIG. 4, the shift register 408 has four stages, each of which is 10 bits wide. Thus, the shift register 408 sequentially receives four 10-bit packet words CA<0:9>. Each of the four packet words CA<0:9> is shifted into the shift register 408, and from one shift register stage to the next, responsive to each transition of the internal clock signal ICLK. The shift register 408 also latches the FLAG signal applied on the flag line 52 coincident with each packet word CA<0:9>. Coincident with the start of each command packet CA<0:39> during normal operation of the memory device 16 (FIG. 1), the FLAG signal transitions high for one-half the period of the internal clock signal ICLK. The shift register 408 shifts this high FLAG signal through each of the four stages of the shift register 12 responsive to each transition of the ICLK signal.

During normal operation, the latched high FLAG signal is used to generate a plurality of control signals as it is shifted through stages of the shift register 408. Once four packet words CA<0:9>, which correspond to a single command packet CA<0:39>, are shifted into the shift register 408, the shift register generates a command trigger signal CTRIGGER. In response to the CTRIGGER signal, a storage register 410 loads the 44-bit contents of the shift register 408 and thereafter continuously outputs these loaded words until new words are loaded in response to the next CTRIGGER signal. In the embodiment shown in FIG. 4 in which four 10-bit packet words C<0:9> and 4 FLAG bits are shifted into the shift register 408, the storage register 410 receives and stores a 40-bit command word C<0:39> and a 4 bit flag-latched word FLAT<0:3>. However, in the more general case, the shift register 408 has N stages, each of which has a width of M bits, and the storage register 410 loads an M*N bit command word.

The synchronization mode of the SLDRAM 16 is signaled by a FLAG signal that is twice the width of the normal FLAG signal, i.e., a double-width FLAG signal having a duration equal to the period of the ICLK signal. In response to the double-width FLAG signal, the shift register 408 activates a calibration signal CAL, causing the synchronization circuit 400 to execute a synchronization procedure to synchronize the CCLK, DCLK0, and DCLK1 clock signals, as will be explained in more detail below. Thus, there will be at least two transitions of the ICLK signal during the double-width FLAG signal. During the synchronization procedure, the shift register 408 once again generates the CTRIGGER signal after four packet words CA<0:9> are shifted into the shift register 408. In response to the active CTRIGGER signal, the storage register 410 again loads and outputs the latched command packet CA<0:39> and flag-latched word FLAT<0:3>. The shift register 408 also applies the CAL and CTRIGGER signals to the control circuit 406, which utilizes the signals in controlling the operation of components in the circuit 400 during the synchronization mode, as will be explained in more detail below.

One embodiment of the shift register 408 that may be utilized in the synchronization circuit 400 is described in more detail in U.S. patent application Ser. No. 08/994,461 to Manning, which is incorporated herein by reference. The detailed circuitry of the shift register 408 will not be discussed in further detail since such circuitry and operation is slightly tangential to the present invention. One skilled in the art will realize, however, the shift register 408 must be capable a latching packet words CA<0:9> received at very high rates during operation of the synchronization circuit 400, and during normal operation of the memory device 16 containing the circuit 400. For example, in one embodiment the command clock CCLK has a frequency of 200 MHz, requiring the shift register circuit 408 to store one packet word CA<0:9> every 2.5 ns (i.e., one packet word in response to each falling and rising edge of the CCLK signal).

The synchronization circuit 400 further includes an evaluation circuit 412 that compares the command word C<0:39> and the flag-latched word FLAT<0:3> output by the storage register 410 to an expected data or synchronization sequence word SYNCSEQ<0:3> generated by the pattern generator 402, and develops a command initialization results signal CINITRES in response to this comparison. The synchronization sequence word SYNCSEQ<0:3> generated by the pattern generator 402 corresponds to the expected values for the bits in the command word C<0:39> and flag-latched word FLAT<0:3> output by the storage register 410, as will be described in more detail below. When the bits of the command word C<0:39> and flag-latched word FLAT<0:3> have their expected values determined by the SYNCSEQ<0:3> word, the evaluation circuit 20 drives the CINITRES signal high, indicating the command packet CA<0:39> and latched FLAG bits were successfully captured. In contrast, when at least one of the bits in the command word C<0:39> or flag-latched word FLAT<0:3> does not have its expected value determined by the SYNCSEQ<0:3> word, the evaluation circuit 412 drives the CINITRES signal inactive low, indicating the command packet CA<0:39> and latched FLAG bits were unsuccessfully captured. The control circuit 406 develops a number of control signals 414 to control the operation of the evaluation circuit 412 and other components in the synchronization circuit 400, as will be explained in more detail below.

Figure 5:
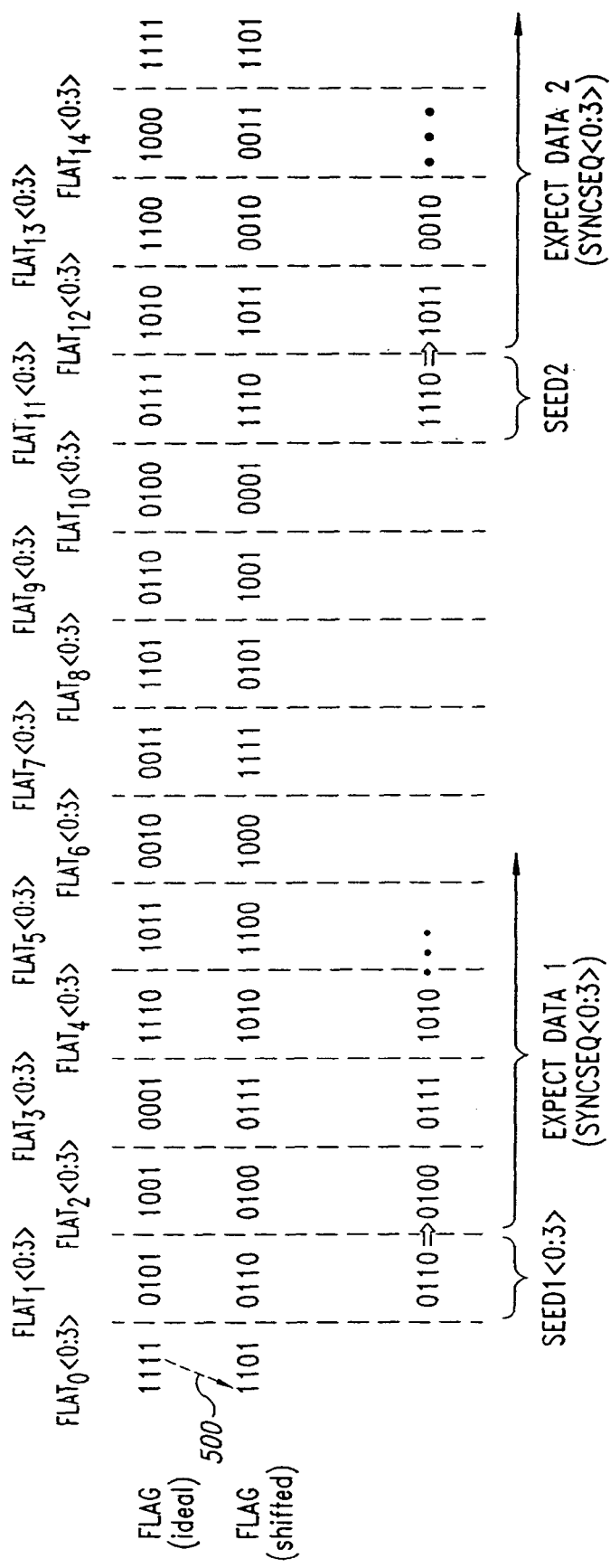
FIG. 5 is a diagram illustrating expect data groups generated by the pattern generator of FIG. 4.

Before describing the overall operation of the synchronization circuit 400, the pattern generator 402 will be described in more detail. As previously mentioned, the pattern generator 402 generates the SYNCSEQ<0:3> word corresponding to expected values for the latched command word CA<0:39> and flag-latched word FLAT<0:3> word. The control circuit 406 applies a seed signal SEED and complementary seed clock signals SCLK, $\overline{SCLK}$ to the pattern generator 402. The pattern generator 402 further receives a seed word SEED<0:3> corresponding to the flag-latched word FLAT<0:3> from the storage register 410. In operation, the pattern generator 402 operates in a seed mode to latch the applied seed word SEED<0:3> when the SEED signal is active high. The pattern generator 402 thereafter operates in a data generation mode when the SEED signal is inactive to generate a series of SYNC-SEQ<0:3> words responsive to the applied clock signals SCLK, $\overline{\text{SCLK}}$, with the specific values for each of the SYNCSEQ<0:3> words in the series being determined by the value of the applied SEED<0:3> word, as will now be explained in more detail with reference to the diagram of FIG. 5. As previously described, during synchronization of the SLDRAM 16, a memory controller (not shown) applies the 15-bit pseudo-random bit sequence on each line of the command-address bus CA, data bus DQ, and FLAG line 52. In FIG. 5, the 15 potential values for the 4-bit sequentially latched flag-latched words FLAT<0:3> are shown, and are designated $FLAT_0$<0:3>–$FLAT_{14}$<0:3>. These are the same as the capture groups C1–C15 of FIG. 3, and have been labeled $FLAT_0$<0:3>–$FLAT_{14}$<0:3> merely to indicate each capture group corresponds to a FLAT<0:3> word. In other words, the flag-latched words $FLAT_0$<0:3>–$FLAT_{14}$<0:3> correspond to the values of four consecutive FLAG bits sequentially latched by the shift register 408. As previously discussed, a FLAG bit is applied coincident with each packet word CA<0:39>, and four packet words comprise a command packet CA<0:39>. Thus, for each of the flag-latched words $FLAT_0$<0:3>–$FLAT_{14}$<0:3> shown in FIG. 5, a corresponding command packet CA<0:39> has been latched.

As previously described, the memory controller (not shown) places the synchronization circuit 400 in the synchronization mode of operation by applying the repeating 15-bit pseudo-random bit sequence for the FLAG bit as indicated in the first row of values for the flag-latched words $FLAT_0$<0:3>–$FLAT_{14}$<0:3>, which is labeled ideal FLAG data. As shown, the memory controller starts this 15-bit pseudo-random bit sequence by applying 1111, then 0101, 1001, and so on as illustrated. Thus, the first row of FIG. 5 represents the ideal expected values for 15 sequentially latched flag-latched words $FLAT_0$<0:3>–$FLAT_{14}$<0:3>. In other words, the memory controller initiates the 15-bit pseudo-random bit sequence by applying 1111 as the first four bits of the FLAG bit, so the ideal value for the flag-latched word $FLAT_0$<0:3> is 1111. The next four FLAG bits applied by the memory controller are 0101, so the ideal value for the flag-latched word $FLAT_0$<0:3> is 0101, and so on for each of the flag-latched words $FLAT_2$<0:3>–$FLAT_{14}$<0:3>, as illustrated in the top row of FIG. 5.

Figure 3:
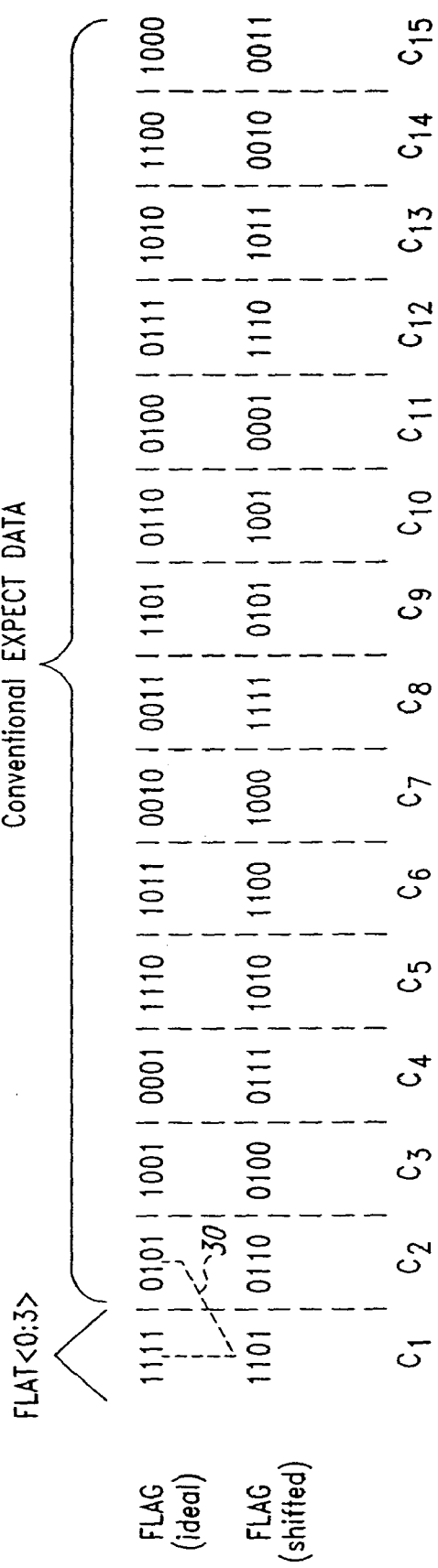
FIG. 3 is a diagram showing a repeating pseudo-random bit sequence, and illustrating conventional expected values for captured groups of that bit sequence, and actual values of captured groups for a time-shifted version of the applied bit sequence.

The second row of FIG. 5 illustrates the shifted version of the repeating 15-bit pseudo-random bit sequence applied on the FLAG line, which was previously discussed with reference to FIG. 3. With the shifted FLAG data pattern, the values for the flag-latched words $FLAT_0$<0:3>–$FLAT_{14}$<0:3> are as shown, and correspond to the ideal FLAG data pattern shifted to the left by two bits. In other words, the first two 1's of the ideal FLAG data pattern are not captured by the shift register 408 (FIG. 4), but instead the shift register 408 begins successfully capturing the applied FLAG bit sequence starting with the third 1, as indicated by the dotted line 500 in FIG. 5. As previously described, when the flag-latched words $FLAT_0$<0:3>–$FLAT_{14}$<0:3> have the values indicated in the shifted FLAG data pattern, a conventional pattern recognition circuit determines the FLAG bit is being improperly latched since none of the $FLAT_1$<0:3>–$FLAT_{14}$<0:3> words in the shifted FLAG data pattern equals the corresponding word in the ideal FLAG data pattern as seen in FIG. 5.

The pattern generator 402 according to one aspect of the present invention eliminates the problem of capturing a shifted version of the ideal FLAG sequence by utilizing the first-captured FLAT<0:3> word as the initial value in the generated expected sequence of FLAT<0:3> words, and then generating the expected values for future FLAT<0:3> words relative to this initial value. In other words, the pattern generator 402 merely generates the ideal sequence of values, but starts generating this sequence with the value immediately after the value of the first captured flag-latched word $FLAT_0$<0:3>. For example, assume the value of $FLAT_0$<0:3> equals 1101, which corresponds to the word $FLAT_8$<0:3> in the ideal sequence. In this situation, the pattern generator 402 generates the value 0110 for the SYNCSEQ<0:3> word, which corresponds to the value of $FLAT_9$<0:3> in the ideal sequence. As seen in the shifted data sequence, $FLAT_2$<0:3> equals 0110 so the pattern generator has generated the correct data. In this way, although the captured bit sequence is shifted relative to the ideal sequence, the pattern generator 402 generates the correct expect data to determine whether this shifted bit sequence is being properly captured by the shift register 408 (FIG. 4) in response to the current phase of the ICLK signal.

Several examples of the operation of the pattern generator 402 are shown in the third row of FIG. 5, and these examples will now be described in more detail to further explain the operation of the pattern generator 402. In the first example, the first four FLAG bits captured by the shift register 408 are 0110, and are labeled SEED1<0:3>. In this situation, the SEED1<0:3> word is applied to the pattern generator 402 and initializes or 'seeds' the pattern generator by giving the pattern generator 402 a reference value from which to start generating future expected values for subsequent flag-latched words FLAT<0:3>. When the SEED1<0:3> word 0110 seeds the pattern generator 402, the pattern generator generates the sequence of words 0100, 0111, 1010, and so on as the expected values for subsequent flag-latched words FLAT<0:3>. As seen from the shifted FLAG data pattern, these subsequent values correspond to the actual values captured for subsequent flag-latched words FLAT<0:3>. In other words, when the SEED1<0:3> word seeds the pattern generator 402, the pattern generator 402 generates values for subsequently latched flag-latched words FLAT<0:3> that equal the correct values for such subsequent flag-latched words in the shifted FLAG data sequence. In the second example, the pattern generator 402 is seeded with a SEED2<0:3> word 1110. When the pattern generator 402 is seeded with the value 1110, it generates the values 1011, 0010, and so on for subsequent values of the flag-latched words FLAT<0:3>, as illustrated. Once again, these subsequent generated values equal the correct values for the shifted FLAG data sequence. Thus, even though the actual FLAG data pattern being latched is shifted relative to the ideal FLAG data pattern, the pattern generator 402 generates correct values for subsequent flag-latched words FLAT<0:3> in response to the SEED2<0:3> word 1110.

Referring back to. FIG. 4, the overall operation of the synchronization circuit 400 will now be described in more detail. To synchronize the command clock signal CCLK applied to the SLDRAM 16 containing the synchronization circuit 400, a processor or memory controller (not shown in FIG. 4) applies the CCLK signal to the SLDRAM, and also applies the 15-bit pseudo-random bit sequence on each line of the command-address bus CA and on the FLAG line 52.

At this point, the control circuit 406 applies an initial phase command word CMDPH<0:3> to the clock generator 404, which, in turn, generates the internal clock signal ICLK having a phase relative to the CCLK signal determined by this initial phase command word. At this point, the shift register 408 latches packet words CA<0:9> applied on the command-address bus CA and FLAG bits applied on the line 52 in response to the ICLK signal. In response to the two high FLAG bits, the shift register 408 activates the calibration signal CAL, placing the synchronization circuit 400 in the synchronization mode of operation. In response to the active CAL signal, the control circuit 406 generates phase command words CMDPH<0:3>, control signals 414, and applies the SEED and SCLK, $\overline{SCLK}$ signals to the pattern generator 402 to perform synchronization of the ICLK signal, as will now be explained in more detail.

After receiving the active CAL signal, the control circuit 406 activates the SEED signal placing the pattern generator 402 in the seed mode in anticipation of seeding the pattern generator. Recall, after the four packet words CA<0:9> comprising a command packet CA<0:39> and the coincident four FLAG bits have been latched by the shift register 408, the shift register outputs the latched command packet as the command word C<0:39> and the four latched FLAG bits as the flag-latched word FLAT<0:3>. The shift register 408 then pulses the CTRIGGER signal active, causing the storage register 410 to load and output the command word C<0:39> and flag-latched word FLAT<0:3>. This first captured flag-latched word FLAT<0:3> output from the storage register 410 is applied as the SEED<0:3> word to the pattern generator 402. At this point, the control circuit 406 clocks the pattern generator 402 with the SCLK, $\overline{SCLK}$ signals, causing the pattern generator 402 to latch the SEED<0:3> word. The control circuit 406 thereafter clocks the pattern generator 402 in response to each CTRIGGER pulse, causing the pattern generator 402 to generate a new synchronization sequence word SYNCSEQ<0:3> word after each subsequent command packet CA<0:39> and coincident four FLAG bits have been latched by the shift register 408. The control circuit 406 also activates the command initialization signal CINIT in response to the active CAL signal. In response to the CINIT signal, the evaluation circuit 412 is enabled in anticipation of comparing the C<0:39> and FLAT<0:3> words to their expected values determined by the SYNCSEQ<0:3> word, as will be described in more detail below.

While the pattern generator 402 is being seeded, the shift register 408 continues latching packet words CA<0:9> applied on the command-address bus CA and FLAG bits applied on the FLAG line 52 in response to the ICLK signal. After the next command packet CA<0:39> and accompanying four FLAG bits have been latched by the shift register 408, the shift register once again generates the CTRIGGER pulse loading the latched command word C<0:39> and flag-latched word FLAT<0:3> into the storage register 410 which, in turn, outputs these words to the evaluation circuit 412. Before the control circuit 406 receives the second CTRIGGER pulse, it deactivates the SEED signal so that the next value of the flag-latched word FLAT<0:3> is not loaded into the pattern generator 402 as the SEED<0:3> word. At this point, the second command word C<0:39> and second flag-latched word FLAT<0:3> are output by the storage register 410 and applied to the evaluation circuit 412. In response to the second CTRIGGER pulse, the control circuit 406 clocks the pattern generator 402 with the SCLK, $\overline{SCLK}$ signals, causing the pattern generator 402 to generate the SYNCSEQ<0:3> word having a value corresponding to the expected values of the second latched C<0:39> and FLAT<0:3> words. Before the evaluation circuit 412 compares the second latched C<0:39> and FLAT<0:3> words to their expected values determined by the SYNCSEQ<0:3> word, the control circuit resets the evaluation circuit 412 which, in turn, drives the command initialization results signal CINITRES active high if that signal was low. The evaluation circuit 412 is reset before the comparison of each new command word C<0:39> and flag-latched word FLAT<0:3>.

The control circuit 406 then enables the evaluation circuit 412 which, when enabled, compares the second latched command word C<0:39> and flag-latched word FLAT<0:3> to their expected values determined by the SYNCSEQ<0:3> word. When the bits of the command word C<0:39> and flag-latched word FLAT<0:3> have their expected values, the evaluation circuit 412 maintains the CINITRES signal high, indicating the command packet CA<0:39> and latched FLAG bits were successfully captured. In contrast, when at least one of the bits in the command word C<0:39> or flag-latched word FLAT<0:3> does not have its expected value, the evaluation circuit 412 drives the CINITRES signal inactive low, indicating the command packet CA<0:39> and latched FLAG bits were not successfully captured.

The control circuit 406 stores the value of the CINITRES signal output by the evaluation circuit 412, and thereafter increments the value of the phase command word CMDPH<0:3> applied to the clock generator 404. In response to the incremented phase command word CMDPH<0:3>, the clock generator generates the ICLK signal having a new phase relative to the CCLK signal corresponding to the new value of the phase command word. In response to the new ICLK signal, which has its phase determined by the new phase command word CMDPH<0:3>, the shift register 408 latches the next four packet words CA<0:9> and four coincident FLAG bits and generates the CTRIGGER pulse after these words have been latched. Once again, the control circuit 406 toggles the SCLK, $\overline{SCLK}$ signals to clock the pattern generator 402 which, in turn, generates the new SYNCSEQ<0:3> word corresponding to the expected new values of the command word C<0:39> and flag-latched word FLAT<0:3>. At this point, control circuit 406 again resets and thereafter enables the evaluation circuit 412 which, when enabled, compares the new C<0:39> and FLAT<0:3> words to their expected values determined by the new SYNCSEQ<0:3> word and generates the resulting CINITRES signal on its output, which is again stored by the control circuit 406.

The control circuit 406 continues incrementing the phase command word CMDPH<0:3> and generating the appropriate control signals to store a number of values for the CINITRES signal, each value corresponding to particular value of the phase command word CMDPH<0:3> (i.e., phase of the ICLK signal). After a predetermined number of values for the CINITRES signal have been stored, the control circuit 406 executes a phase selection procedure to select a final phase command word CNDPH<0:3> from among the phase command words that resulted in the successful capture of the command packet CA<0:39> and FLAG bits. In one embodiment, the control circuit 406 stores sixteen values for the CINITRES signal each corresponding to one of sixteen value for the phase command word CMDPH<0:3>, and selects the final phase command from among the ones of these sixteen values that resulted in the successful capture of the command packet CA<0:39> and FLAG bits. One procedure that may be executed by the control circuit 406 in determining the final phase command word is described in the Baker et al. patent application that was previously referenced, and which has been incorporated herein by such reference. Upon determining the final phase command word CMDPH<0:3>, the control circuit 406 stores this value and continually applies it to the variable-phase clock generation circuit 404 during normal operation of the SLDRAM 16 (FIG. 1) containing the synchronization circuit 400 and pattern generator 402.

One skilled in the art will realize that the procedure executed by the control circuit 406 in synchronizing the command clock signal CCLK may vary. For example, in the above-described procedure the control circuit 406 captures only one command packet CA<0:39> and flag-latched word FLAT<0:3> at each phase of the ICLK signal. In another embodiment, the control circuit 406 performs a predetermined number of comparisons at a given phase of the ICLK signal before storing a value for the CINITRES signal. In this embodiment, the control circuit 406 may, for example, control components of the synchronization circuit 400 so that eight command words C<0:39> and flag-latched words FLAT<0:3> are captured and compared at each phase of the ICLK signal. When all eight of these comparisons indicate successful captures, the control circuit 406 stores a "1" for the CINITRES signal at this phase. However, if any of the comparisons at a given phase indicates an unsuccessful capture, the control circuit 406 stores a "0" for the CINITRES signal at this phase. Once again, after sixteen, for example, CINITRES signals have been stored, the control circuit 406 determines the final phase command word.

During synchronization of the data clock signals DCLK0 and DCLK1, the synchronization circuit 400 typically applies four latched bits on the data line D0, which are designated a data-latched word DOL<0:3>, as the SEED<0:3> word to the pattern generator 402 instead of the flag-latched word FLAT<0:3> as during synchronization of the CCLK signal. In this way, the data applied on the data line D0 of the data bus DQ is utilized to seed the pattern generator 402 during synchronization of the data clock signals DCLK0 and DCLK1. In addition, the control circuit 406 deactivates the CINIT signal when either of the data clocks DCLK0 and CDLK1 is being synchronized to thereby disable the evaluation circuit 412.

Figure 6:
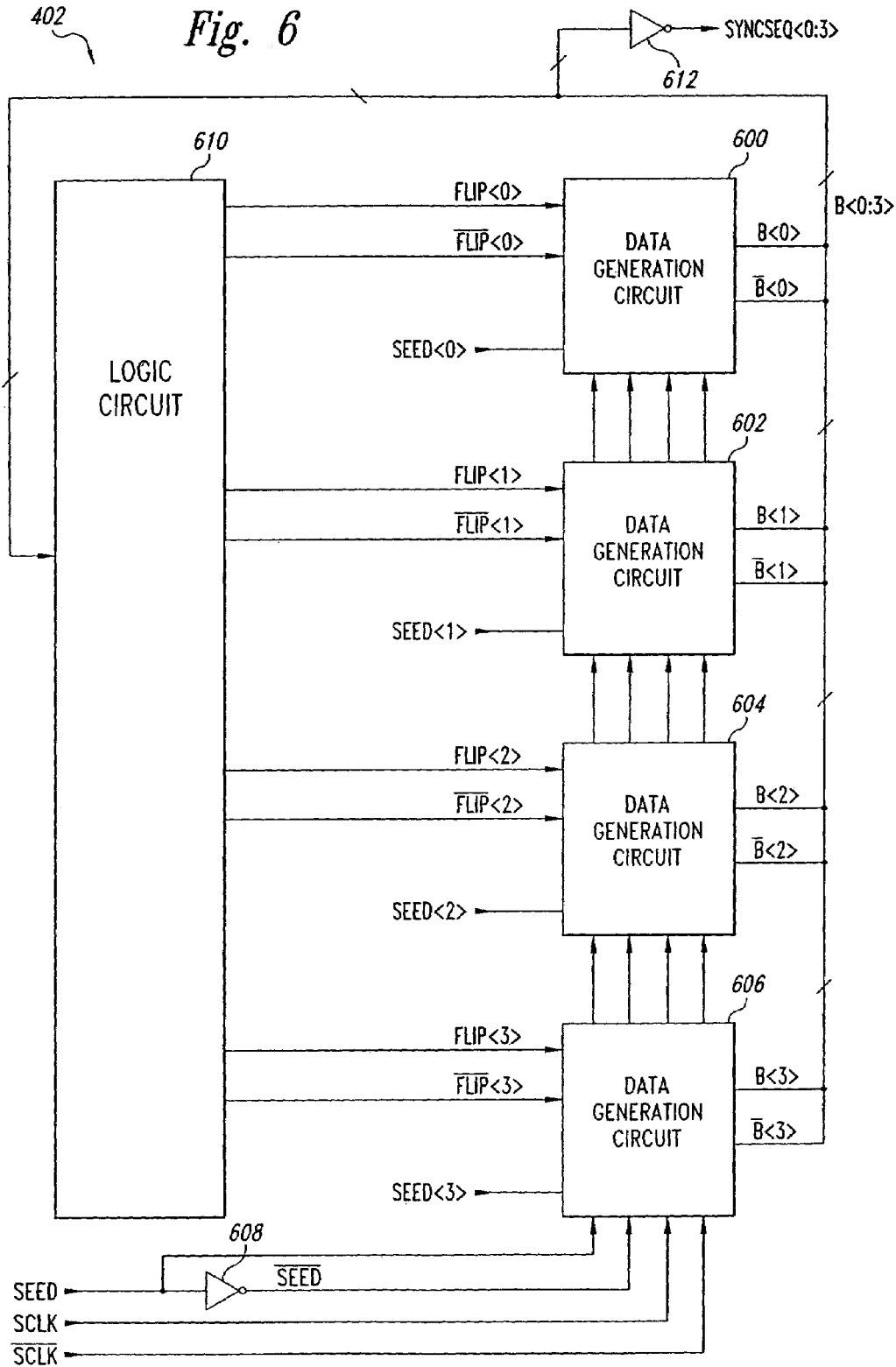
FIG. 6 is a more detailed schematic of one embodiment of the pattern generator of FIG. 4.

FIG. 6 is a more detailed functional block diagram of one embodiment of the pattern generator 402 of FIG. 4. The pattern generator 402 includes four data generation circuits 600–606 receiving respective bits of the SEED<0:3> word output by the storage register 410 (FIG. 4). The data generation circuits 600–606 further receive the SEED signal directly and through an inverter 608, and the clock signals SCLK, $\overline{SCLK}$ from the control circuit 406 (FIG. 4). A logic circuit 610 applies complementary pairs of flip data signals FLIP<0>, $\overline{FLIP<0>}$–FLIP<3>, $\overline{FLIP<3>}$ to the data generation circuits 600–606, respectively, in response to an expect data word B<0:3> output collectively by the data generation circuits 600–606, as will now be explained in more detail below. The expect data word B<0:3> includes both true and complement versions of each bit output by respective circuits 600–606, and is applied through an inverter 612 to generate the synchronization sequence word SYNCSEQ<0:3>. Although only a single inverter 612 is shown in FIG. 6, one skilled in the art will realize there are actually four such inverters, one for each bit of the expect data word B<0:3>.

In operation, the data generation circuits 600–606 operation in one of two modes, a seed mode and a generation mode. In the following description, only the SCLK signal will be discussed, one skilled in the art understanding that the $\overline{SCLK}$ signal merely has the complementary value of the SCLK signal. Initially, the control circuit 406 activates the SEED signal, placing the data generation circuits 600–606 in the seed mode of operation. In the seed mode, the data generation circuits 600–606 latch the value of the applied SEED<0:3>word and shift this word to their outputs as the expect data word B<0:3> responsive to the clock signals SCLK, $\overline{SCLK}$. During the seed mode of operation, the values of the FLIP signals generated by the logic circuit 610 are ignored by the data generation circuits 600–606.

The control circuit 406 thereafter deactivates the SEED signal, placing the data generation circuits 600–606 in the generation mode of operation. During the generation mode of operation, the current value of the expect data word B<0:3> is applied to the logic circuit 610 which, in turn, develops the FLIP signals having values that are determined by the value of the expect data word B<0:3>. The FLIP signals are clocked into the data generation circuits 600–606 in response to the applied SCLK signal, and the data generation circuits 600–606 thereafter generate a new expect data word B<0:3> having a value determined by the values of the FLIP signals. This new expect data word B<0:3> is then output through the inverter 612 as the synchronization sequence word SYNCSEQ<0:3> and applied to the evaluation circuit 412, as previously described with reference to FIG. 4. In addition, the new expect data word B<0:3> is also fed back to the logic circuit 610, which, in turn, once again develops new values for the FLIP signals in response to this new expect data word. The new values for the FLIP signals are once again clocked into the data generation circuits 600–606 in response to the SCLK signal, and the data generation circuits generate a new expect data word B<0:3> having a value determined by the values of these new FLIP signals. The new value for the expect data word B<0:3> is once again applied through the inverter 612 to generate the new synchronization sequence word SYNCSEQ<0:3>. This process continues as long as the clock signal SCLK clocks the data generation circuits 600–606, or until the SEED signal again goes active, loading a new SEED<0:3> word into the data generation circuits 600–606. In this situation, the pattern generator 402 begins generating a new sequence of expect data words B<0:3> in response to this new SEED<0:3> word.

Figure 7:
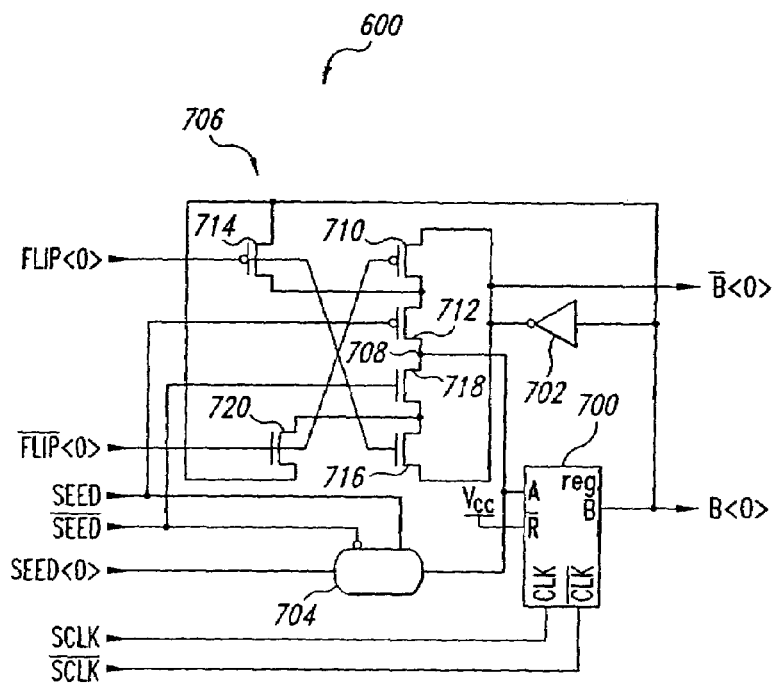
FIG. 7 is a more detailed schematic illustrating one of the data generation circuits of FIG. 6.

The overall operation of the pattern generator 402 and general operation of several components within that circuit have now been described with reference to FIG. 6. At this point, several of these components will now be described in more detail with reference to FIGS. 7–9. FIG. 7 is a schematic illustrating one embodiment of the data generation circuit 600 of FIG. 6. The data generation circuits 600–606 of FIG. 6 are typically identical, and thus, for the sake of brevity, only the data generation circuit 600 will be described in more detail. The data generation circuit 600 includes a register 700 that is clocked by the SCLK, $\overline{SCLK}$ signals. In response to these clock signals, the register 700 shifts a signal applied on its input to its output to develop the B<0> signal, and this signal is applied through an inverter 702 to develop the $\overline{B<0>}$ signal. A transmission or pass gate 704 applies the SEED<0> bit to the input of the register 700 in response to the SEED, $\overline{SEED}$ signals. When the SEED and $\overline{SEED}$ signals are high and low, respectively, the pass gate 704 turns ON applying the SEED<0> signal to the input of the register 700. The pass gate 704 turns OFF, isolating the SEED<0> signal from the register 700 when the SEED and $\overline{SEED}$ signals are low and high, respectively.

A feedback coupling circuit 706 includes an output node 708 that is also coupled to the input of the register 700. A pair of series connected PMOS transistors 710 and 712 couple the expect data signal $\overline{B}$<0> to the output node 708 in response to the $\overline{FLIP}$<0> and SEED signals applied on their respective gates. When the $\overline{FLIP}$<0> and SEED signals are both low, the transistors 710 and 712 turn ON coupling the expect data signal $\overline{B}$<0> to the output node 708. If either of the $\overline{FLIP}$<0> or SEED signals is high, the corresponding one of the transistors 710 and 712 turns OFF isolating the $\overline{B}$<0> signal from the output node 708. A PMOS transistor 714 receives the FLIP<0> signal on its gate and operates in conjunction with the transistor 712 to couple the expect data signal B<0> to the output node 708. When the FLIP<0> and SEED signals are both low, the transistors 712 and 714 turn ON coupling the expect data signal B<0> to the output node 708. If either of the SEED or FLIP<0> signals are high, the corresponding one of the transistors 712 and 714 turns OFF, isolating the expect data signal B<0> from the output node 708. The feedback coupling circuit 706 further includes three NMOS transistors 716–720 coupled in the same way as the PMOS transistors 710–714, respectively, as shown. When the $\overline{SEED}$ and FLIP<0> signals are high, the transistors 716 and 718 turn ON, coupling the expect data signal $\overline{B}$<0> to the output node 708. When the $\overline{SEED}$ and $\overline{FLIP}$<0> signals are high, the transistors 718 and 720 turn ON, coupling the expect data signal B<0> to the output node 708.

In operation, the data generation circuit 600 operates in one of two modes, a seed mode and a data generation mode, as previously discussed with reference to FIG. 6. During the seed mode the SEED and $\overline{SEED}$ signals are high and low, respectively, turning ON the pass gate 704 and thereby coupling the SEED<0> signal to the input of the register 700. In addition, the high SEED signal and low $\overline{SEED}$ signal turn OFF the transistors 712 and 718, respectively, isolating the output node 708 from the remaining circuitry of the feedback coupling circuit 706. At this point, the register 700 is clocked by the SCLK, $\overline{SCLK}$ signals and shifts the SEED<0> signal applied on its input to its output as the expect data signal B<0>. In this way, during the seed mode of operation, the SEED<0> bit is shifted to the output of the register 700 as the first expect data bit B<0>. The SEED and $\overline{SEED}$ signals thereafter go low and high, respectively, initiating operation of the data generation circuit 600 in the data generation mode.

During the data generation mode of operation, the feedback coupling circuit 706 couples either the expect data signal B<0> or its complement $\overline{B}$<0> to the input of the register 700 in response to the values of the FLIP<0> and $\overline{FLIP}$<0> signals, and the register 700 is clocked by the SCLK, $\overline{SCLK}$ signals to shift the signal on its input to its output as the new expect data signal B<0>, as will now be explained in more detail. In the data generation mode, the SEED and $\overline{SEED}$ signals are low and high, respectively, turning ON the transistors 712 and 718. When the transistors 712 and 718 are turned ON, the values of the FLIP<0> and $\overline{FLIP}$<0> signals determine whether the expect data signal B<0> or $\overline{B}$<0> is coupled to the output node 708 and thereby to the input of the register 700. When the FLIP<0> and $\overline{FLIP}$<0> signals are high and low, respectively, the transistors 714 and 720 turn OFF and transistors 710 and 716 turn ON. When transistors 714 and 720 turn OFF, the expect data signal B<0> is isolated from the output node 708. In response to the turned ON transistors 710 and 716, the expect data signal $\overline{B}$<0> is applied through both the series connected transistors 710,712 and 716,718 to the output node 708 and is thus applied as the new input to the register 700. As previously explained, the new expect data signal $\overline{B}$<0> is thereafter shifted to the output of the register 700 as the new expect data signal B<0> in response to the SCLK, $\overline{SCLK}$ signals. Thus, when the FLIP<0> and $\overline{FLIP}$<0> signals are high and low, respectively, the expect data signal $\overline{B}$<0> is shifted to the output of the register 700 as the new expect data signal B<0>. In other words, when the FLIP<0> and $\overline{FLIP}$<0> signals are high and low, respectively, the new value for the expect data signal B<0> is the complement of its previous value. It should be noted that in this situation the expect data signal $\overline{B}$<0> is coupled to the output node 708 through two pairs of series connected transistors, the PMOS series connected pair 710 and 712 and the NMOS connected pair 716 and 718. This is done so that regardless of the value of the expect data signal $\overline{B}$<0>, the full voltage corresponding to this value is coupled to the output node 708 which would not occur for one of the logic levels of the signal $\overline{B}$<0> if both NMOS and PMOS transistors were not used, as will be understood by one skilled in the art.

When the FLIP<0> and $\overline{FLIP}$<0> signals are low and high, respectively, the transistors 710 and 716 turn OFF, isolating the expect data signal $\overline{B}$<0> from the output node 708, and the transistors 714 and 720 turn ON coupling the expect data signal B<0> through both the series connected transistors 712,714 and 718,720 to the output node 708 and thereby to the input of the register 700. Thus, when the FLIP<0> and $\overline{FLIP}$<0> signals are low and high, respectively, the current expect data signal B<0> is applied to the input of the register 700 and thereafter shifted to the output of the register 700 as the new expect data signal B<0> in response to the SCLK, $\overline{SCLK}$ signals. In other words, when the FLIP<0> and $\overline{FLIP}$<0> signals are low and high respectively, the new value for the expect data signal B<0> is the same as its prior value. In this way, the data generation circuit 600 generates either a 0 or 1 for the expect data signal B<0> as it is clocked by the SCLK, $\overline{SCLK}$ signals, with the value of the new expect data signal B<0> being determined by the values of the FLIP<0> and $\overline{FLIP}$<0> signals.

Figure 8:
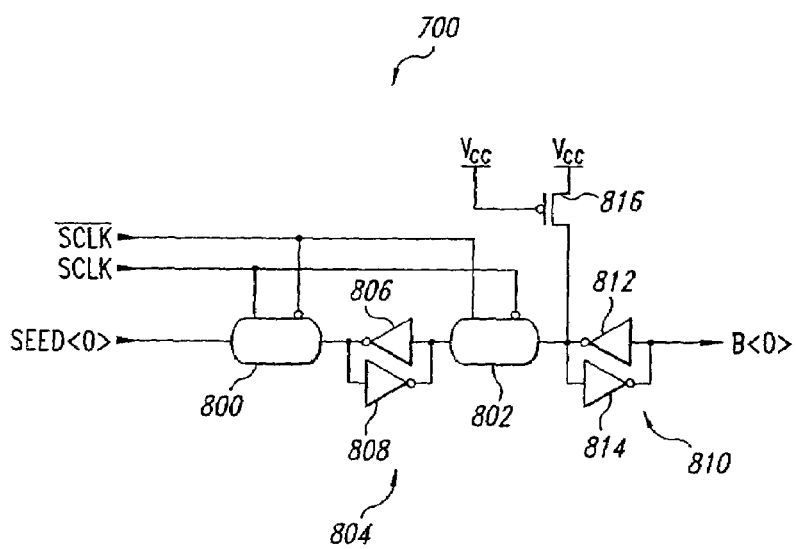
FIG. 8 is a more detailed schematic of the register of FIG. 7.

FIG. 8 is a detailed schematic of one embodiment of the register 700 of FIG. 7. In the register 700, first and second pass gates 800 and 802 are activated in a complementary manner in response to the clock signals SCLK, $\overline{SCLK}$. When the SCLK and $\overline{SCLK}$ signals are high and low, respectively, the pass gate 800 turns ON and pass gate 802 turns OFF, and the converse is true when the values of the clock signals SCLK, $\overline{SCLK}$ are complemented. When the pass gate 800 is activated, it couples the SEED<0> signal to an input of a latch 804 including cross-coupled inverters 806 and 808. The latch 804 latches its input to the value of the applied SEED<0> signal, and its output to the complement of this value. When the pass gate 802 is activated, it applies the output of the latch 804 to an input of a latch 810 including cross-coupled inverters 812 and 814. The latch 810 latches its input to the value of a signal applied on that input, and latches the expect data signal B<0> on its output to the complement of the value on its input. A PMOS reset transistor 816 is coupled between the supply voltage source $V_{CC}$ and the input of the latch 810 and operates, when activated, to drive the input of the latch 810 high, which, in turn, latches the expect data signal B<0> low. In the embodiment of FIG. 8, however, the reset transistor 816 receives the supply voltage source $V_{CC}$ on its gate, turning OFF the transistor 816 so that it does not effect operation of the register 700. In operation, the register 700 shifts the SEED<0> signal through the pass gate 800 to the latch 804 when the SCLK and $\overline{SCLK}$ signals are high and low, respectively. When the SCLK and $\overline{SCLK}$ signals go low and high, respectively, the register 700 shifts the value stored in the latch 804 through the turned ON pass gate 802 to the latch 810 and in this way shifts the SEED<0> signal to the output of the latch 810 as the expect data signal B<0>.

Figure 9:
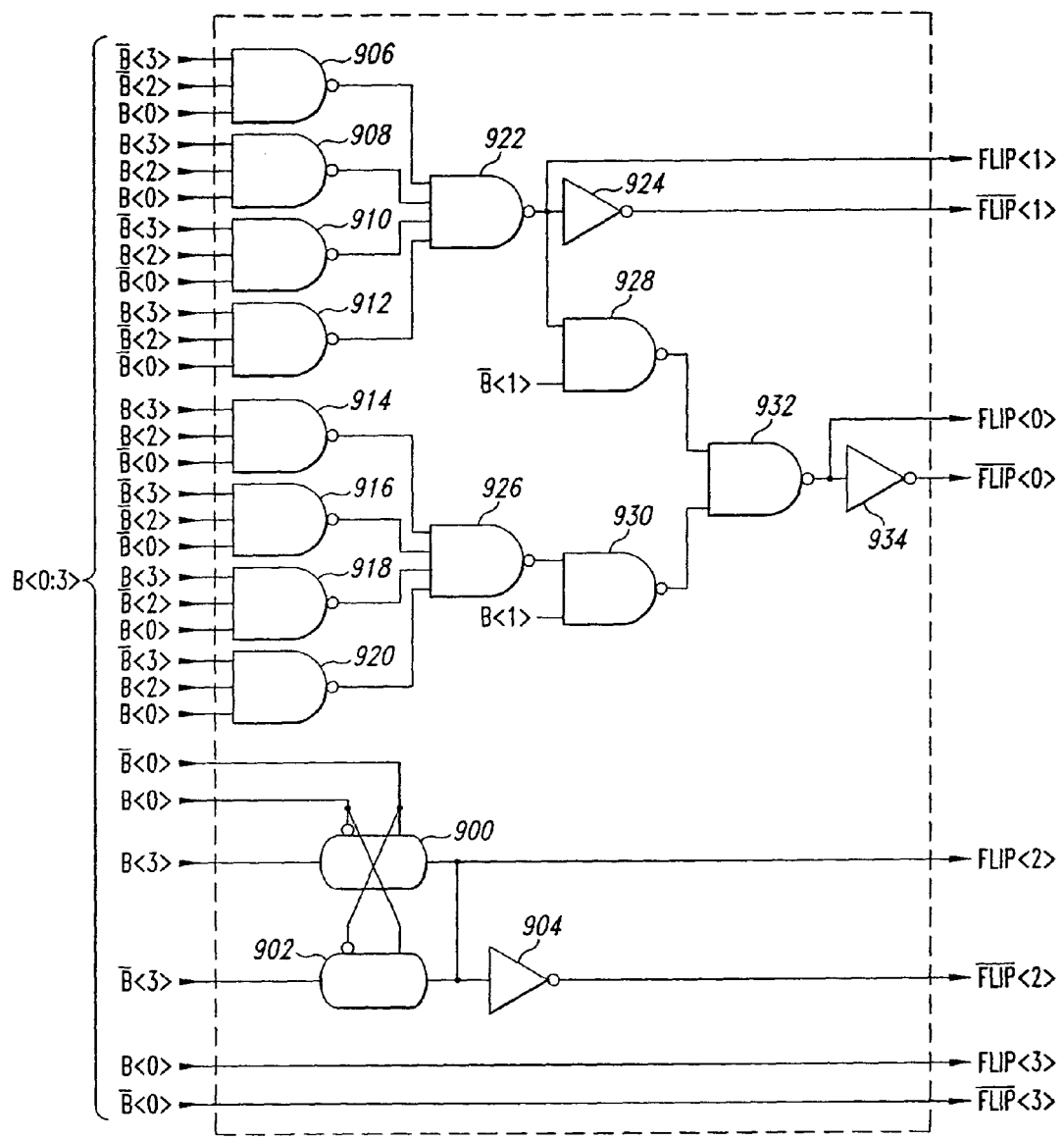
FIG. 9 is a logic diagram of one embodiment of the logic circuit 610 of FIG. 6.

FIG. 9 is a more detailed logic diagram of one embodiment of the logic circuit 610 of FIG. 6. As previously described with reference to FIG. 6, the logic circuit 610 receives the current value of the expect data word B<0:3> and generates the FLIP signals in response to this expect data word. Recall, the FLIP signals are utilized by the data generation circuits 600–606 during their data generation mode of operation to generate new values for the expect data word B<0:3> in response to the previous value for the expect data word. In the embodiment of FIG. 9, the bits B<0> and $\overline{B}$<0> generate the FLIP<3> and $\overline{FLIP}$<3> signals, respectively. A pair of pass gates 900 and 902 operate in a complementary manner in response to the B<0> and $\overline{B}$<0> signals to apply either the B<3> or $\overline{B}$<3> signal directly and through an inverter 904 to develop the FLIP<2> and $\overline{FLIP}$<2>. A first group of NAND gates 906-920 receive specific combinations of the true and complement bits of the expect data word B<0:3>, and generate respective outputs in response to these signals. The outputs of the NAND gates 906-912 are combined by a NAND gate 922 having its output coupled directly and through an inverter 924 to develop the FLIP<1> and $\overline{FLIP}$<1> signals. The group of NAND gates 914–920 have their outputs combined by a NAND gate 926. A group of NAND gates 928–932 then combine the outputs of the NAND gates 922 and 926 along with the expect data signals B<1> and $\overline{B}$<1>, and the output of the NAND gate 932 is applied directly and through an inverter 934 to develop the FLIP<0> and $\overline{FLIP}$<0> signals.

The logic circuit 610 develops the FLIP signals having values that cause the pattern generator 402 of FIG. 6 is generate a sequence of expect data words B<0:3> having values determined by the repeating 15-bit pseudo-random bit sequence of Table 1. Referring back to Table 1, if the flag-latched word FLAT<0:3> applied as the SEED<0:3> word to the pattern generator 402 equals 0101, the logic circuit 610 generates values for the FLIP signals causing the pattern generator 402 to generate 1001 for the next value of the expect data word B<0:3> then 0001 for the word B<0:3>, and so on as previously described. One skilled in the art will realize a myriad of alternative embodiments may be utilized for the logic circuit 610 in order to develop FLIP signals having values that cause the pattern generator 402 to generate expect data words B<0:3> for this and other repeating bit sequences.

Figure 10:
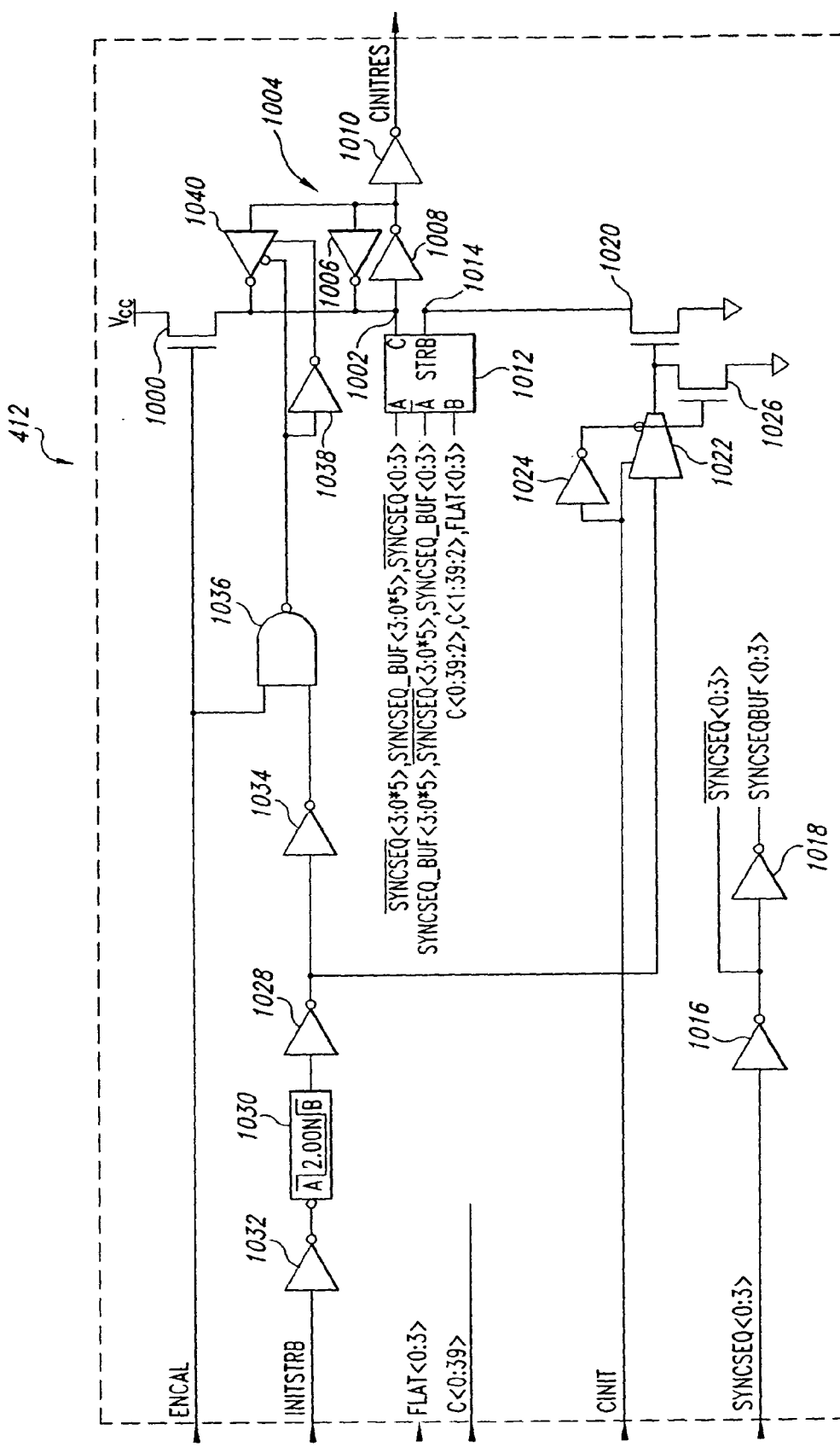
FIG. 10 is a more detailed schematic of one embodiment of the evaluation circuit of FIG. 4.

FIG. 10 illustrates one embodiment of the evaluation circuit 412 of FIG. 4, which, as previously described, compares the command word C<0:39> and flag-latched word FLAT<0:3> to expected values determined by the SYNCSEQ<0:3> word, and generates the CINITRES signal having a value indicating the result of this comparison. The evaluation circuit 412 includes a PMOS reset transistor 1000 coupled between a supply voltage source $V_{CC}$ and a sensing node 1002 and receiving an enable calibration signal ENCAL from the control circuit 406 applied on its gate. A latch 1004 including two cross-coupled inverters 1006, 1008 has its input coupled to the sensing node 1002 and its output coupled to an input of an inverter 1010 which develops the CINITRES signal on its output in response to the output of the latch 1004.

The evaluation circuit 412 further includes a compare circuit 1012 coupled between the sensing node 1002 and an enable node 1014. The compare circuit 1012 receives the latched command word C<0:39> and flag-latched word FLAT<0:3> corresponding to the captured command packet received on the command-address bus CA and latched FLAG bits received on the flag line 52, as previously described. In addition, the compare circuit 1012 further receives a plurality of signals derived from the synchronization sequence word SYNCSEQ<0:3> generated by the pattern generator 402. More specifically, each bit of the synchronization sequence word SYNCSEQ<0:3> is coupled through a respective inverter 1016 to generate a complementary synchronization sequence word $\overline{SYNCSEQ}$<0:3> which, in turn, is further coupled through a respective inverter 1018 to generate a buffered synchronization sequence word SYNCSEQBUF<0:3>. The $\overline{SYNCHSEQ}$<0:3> and SYNCHSEQBUF<0:3> words are utilized by the compare circuit 1012 in determining whether each of the bits in the command word C<0:39> and latched FLAG word FLAT<0:3> has its expected value, as will be explained in more detail below.

The evaluation circuit 412 further includes an enable transistor 1020 coupled between the enable node 1014 and ground. An inverter 1028 has its output applied through a transmission gate 1022 to the gate of the enable transistor 1020. The control circuit 406 applies a command initialization signal CINIT directly and through an inverter 1024 to the control terminals of the transmission gate 1022. The output of the inverter 1024 is further applied to a gate of a transistor 1026 coupled between the gate of the enable transistor 1020 and ground. When the CINIT signal goes active high, the inverter 1024 drives its output low turning OFF the transistor 1026 and turning ON the transmission gate 1022 and thereby coupling the output of the inverter 1028 to the gate of the enable transistor 1020. Thus, when the CINIT signal is active high, the level at the output of the inverter 1028 determines whether the enable transistor 1020 turns ON or OFF. The control circuit 406 applies an initialization strobe signal INITSTRB through an inverter 1032 to an input of a pulse generator 1030 which, in turn, outputs a pulse signal to the input of the inverter 1028. When the INITSTRB signal goes active high, the inverter 1032 drives its output low causing the pulse generator 1030 to apply a low pulse signal on the input of the inverter 1028, which, in turn, drives its output high for the duration of this pulse. This high output from the inverter 1028 is coupled through the transmission gate 1022, when activated, turning ON the enable transistor 1022.

The output of the inverter 1028 is further coupled through an inverter 1034 to one input of a NAND gate 1036 receiving the ENCAL signal on a second input. The output of the NAND gate 1036 is applied directly and through an inverter 1038 to enable terminals of a buffer 1040 coupled between the output of the latch 1004 and the sensing node 1002 as shown. When the output of the NAND gate 1036 goes low, the buffer 1040 is enabled and applies the inverse of the signal on the output of the latch 1004 on the sensing node 1002. If the output of the NAND gate 1036 is high, the buffer 1040 is disabled, placing its output in a high impedance state.

Figure 11:
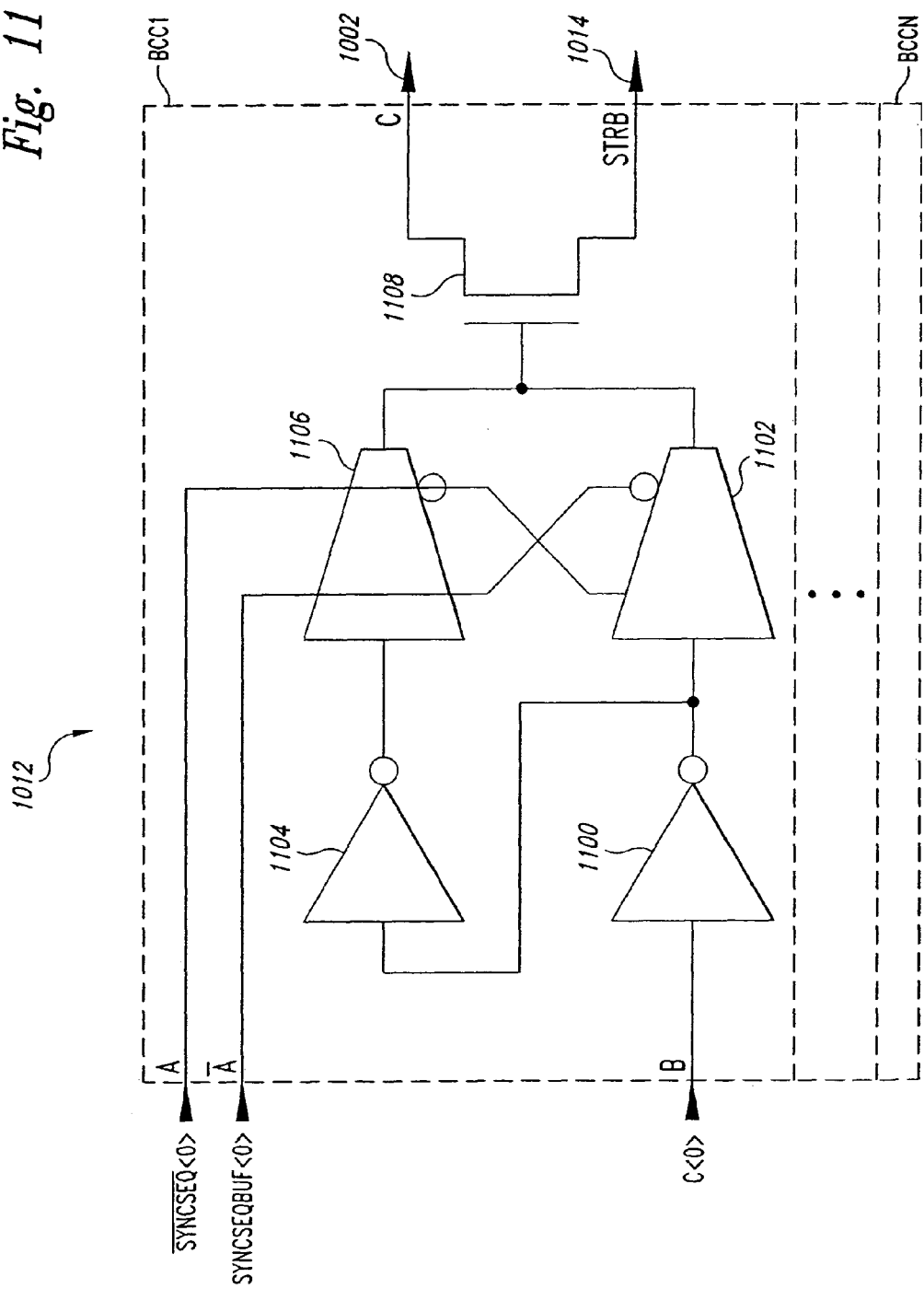
FIG. 11 is a more detailed schematic of one embodiment of the compare circuit of FIG. 10.

FIG. 11 is a more detailed schematic of the compare circuit 1012 of FIG. 10 including a plurality of bit compare circuits BCC1-BCCN. There is one bit compare circuit BCC1-BCCN for each bit compared by the compare circuit 1012. In the embodiment of FIG. 11, the compare circuit 1012 includes 44 bit compare circuit BCC1-BCC44, one for each bit of the command word C<0:39> and flag-latched word FLAT<0:3>. All the bit compare circuits BCC1-BCCN are identical, and thus, for the sake of brevity, only the bit compare circuit BCC1 will be described in more detail. The bit compare circuit BCC1 receives the bit C<0> of the command word C<0:39>, and applies this bit through a first inverter 1100 to an input of a first transmission gate 1102, and through the first inverter 1100 and a second inverter 1104 to the input of a second transmission gate 1106. The transmission gates 1102 and 1106 receive the $\overline{\text{SYNCSEQ}}$<0> and SYNCSEQBUF<0> signals on their respective control terminals as shown, and are activated in a complementary manner in response to the values of these signals. When the $\overline{\text{SYNCSEQ}}$<0> signal is high and SYNCSEQBUF<0> signal is low, the transmission gate 1102 turns ON and transmission gate 1106 turns OFF, and when the signals $\overline{\text{SYNCSEQ}}$<0> and SYNCSEQBUF<0> are low and high, respectively, the transmission gate 1106 turns ON and transmission gate 1102 turns OFF. The outputs of the transmission gates 1102 and 1106 are applied to a gate of a comparison transistor 1108 coupled between the sensing node 1002 and the enable node 1014.

In operation, the bit compare circuit BCC1 compares the value of the bit C<0> to its expected value determined by the values of the bits $\overline{\text{SYNCSEQ}}$<0> and SYNCSEQBUF<0> and activates the compare transistor 1108 when the bit C<0> does not have its expected value, as will now be explained in more detail. The pattern generator 402 (see FIG. 4) determines an expected value for the command bit C<0> corresponding to one of the bits in the SYNCSEQ<0:3> word from the flag-latched word FLAT<0:3>, as previously described. When the expected value of the command bit C<0> is high, the pattern generator 402 drives the $\overline{\text{SYNCSEQ}}$<0> and SYNCSEQBUF<0> signals high and low, respectively, turning ON transmission gate 1102 and turning OFF transmission gate 1106. The command bit C<0> is then applied through the inverter 1100 and through the turned ON transmission gate 1102 to the gate of the compare transistor 1108. If the command bit C<0> is high as expected, the inverter 1100 applies a low signal through the transmission gate 1102 to the gate of the compare transistor 1108, turning OFF this transistor. In contrast, if the command bit C<0> is a binary 0 instead of a binary 1 as expected, the inverter 1100 drives its output high and this high output is applied through the transmission gate 1102 to the gate of the transistor 1108. In response to the high signal on its gate, the transistor 1108 turns ON, coupling the sensing node 1002 to the enable node 1014.

When the expected value of the command bit C<0> is a binary 0, the pattern generator 402 drives the $\overline{\text{SYNCSEQ}}$<0> and SYNCSEQBUF<0> signals low and high, respectively, turning ON the transmission gate 1106 and turning OFF the transmission gate 1102. The command bit C<0> is then applied through the inverters 1100 and 1104 and through the turned ON transmission gate 1106 to the gate of the compare transistor 1108. If the command bit C<0> is a binary 0 as expected, the inverter 1104 drives its output low, turning OFF the transistor 1108 and isolating the sensing node 1002 from the enable node 1014. In contrast, if the command bit C<0> is not a binary 0 as expected but is instead a binary 1, the inverter 1104 drives its output high, turning ON the transistor 1108 which couples the sensing node 1002 to the enable node 1014.

Returning now to FIG. 10, the overall operation of the evaluation circuit 412 in comparing the value of each bit in the command word C<0:39> and flag-latched word FLAT<0:3> to its expected value will now be described in more detail. As previously described with reference to FIG. 4, the control circuit 406 applies the CINIT, ENCAL, and INITSTRB signals (i.e., indicated as control signals 414 in FIG. 4) to control operation of the evaluation circuit 412. When the CINIT signal is inactive low, the transmission gate 1022 turns OFF and the transistor 1026 turns ON. The turned ON transistor 1026 couples the gate of the enable transistor to ground, turning OFF the enable transistor 1020 which isolates the enable node 1014 from ground. In this situation, the evaluation circuit 412 is deactivated and does not evaluate the command word C<0:39> and flag-latched word FLAT<0:3>.

The evaluation circuit 412 is enabled when the CINIT signal is active high turning ON the transmission gate 1022 and enable transistor 1020, which couples the enable node 1014 to approximately ground. The ENCAL signal goes inactive low before evaluation of a particular command word C<0:39> and flag-latched word FLAT<0:3>. In response to the low ENCAL signal, the transistor 1000 turns ON, coupling the sensing node 1002 to approximately the supply voltage $V_{CC}$. In response to the high on the sensing node 1002, the latch 1004 drives its output low and the inverter 1010, in turn, drives the CINITRES signal on its output high. At this point, the INITSTRB signal is inactive low and the pulse generator 1030 drives its output high causing the inverter 1028 to drive its output low. The low output from the inverter 1028 is applied through the turned ON transmission gate 1022 to the gate of the enable transistor 1020, turning OFF this transistor and thereby isolating the enable node 1014 from ground. It should be noted that when the ENCAL signal goes inactive low, the NAND gate 1036 deactivates the buffer 1040 enabling the transistor 1000 to more easily drive the sensing node 1002 high.

Once the ENCAL signal has gone inactive low, disabling and resetting the evaluation circuit 412, the ENCAL signal thereafter goes active high, enabling the evaluation circuit 412 to begin comparing latched command words C<0:39> and flag-latched words FLAT<0:3>. At this point, the pattern generator 402 applies the generated synchronization sequence word SYNCSEQ<0:3> to the evaluation circuit 412 and the corresponding $\overline{\text{SYNCSEQ}}$<0:3> and SYNCSEQBUF<0:3> words are, in turn, applied to the compare circuit 1012, indicating the expected value for each of the bits in the latched C<0:39> and FLAT<0:3> words. At this point, the expected data in the form of the $\overline{\text{SYNCSEQ}}$<0:3> and SYNCSEQBUF<0:3> words and the latched data in the form of the C<0:39> and FLAT<0:3> words are applied to the compare circuit 1012, but the compare circuit 1012 is not yet enabled since the transistor 1020 is turned OFF. The INITSTRB signal then goes active high and the pulse generator 1030, in turn, generates the low pulse on its output, causing the inverter 1028 to pulse its output high and thereby turn ON the enable transistor 1020 so that the compare circuit 1012 compares the latched command word C<0:39> and flag-latched word FLAT<0:3> to the expected data.

As previously described with reference to FIG. 11, when each bit of the command word C<0:39> and flag-latched word FLAT<0:3> has its expected value, the corresponding compare transistor 1108 coupled between the sensing node 1002 and enable node 1014 does not turn ON. Thus, when the latched command words C<0:39> and FLAT<0:3> have their expected values, none of the transistors 1108 in the compare circuit 1012 turns ON and the sensing node 1002 remains at approximately the supply voltage $V_{CC}$. Accordingly, when the words C<0:39> and FLAT<0:3> have their expected values, the voltage on the sensing node 1002 remains high such that the latch 1004 maintains its output low and the inverter 1010 continues driving the CINITRES signal active high indicating the latched words C<0:39> and FLAT<0:3> were successfully captured. If any of the bits in the words C<0:39> and FLAT<0:3> does not have its expected value, the corresponding compare transistor 1108 turns ON, coupling the sensing node 1002 to approximately ground. When the sensing node 1002 goes low, the latch 1004 drives its output high causing the inverter 1010 to drive the CINITRES signal low, indicating the C<0:39> and FLAT<0:3> words were not successfully captured.

It should be noted that the low pulse on the output of the pulse generator 1030 results in the inverter 1034 also pulsing its output low, which causes the NAND gate 1036 to drive its output high for the duration of this pulse. As previously described, when the output of the NAND gate 1036 goes high, the buffer 1040 is disabled to enable the sensing node 1002 to be more easily driven low if any of the bits were not successfully captured. After the end of the pulse generated by the pulse generator 1030, the NAND gate 1036 again drives its output low enabling the buffer 1040 to drive the sensing node 1002 to its desired value. As will be understood by one skilled in the art, the sensing node 1002 may present a rather large capacitance due to all the components coupled in parallel to this node, and the buffer 1040 includes transistors sized such that the buffer 1040 may drive this relatively large capacitance to its desired voltage and in this way assists the inverter 1006, which typically has smaller sized transistors.

Figure 12:
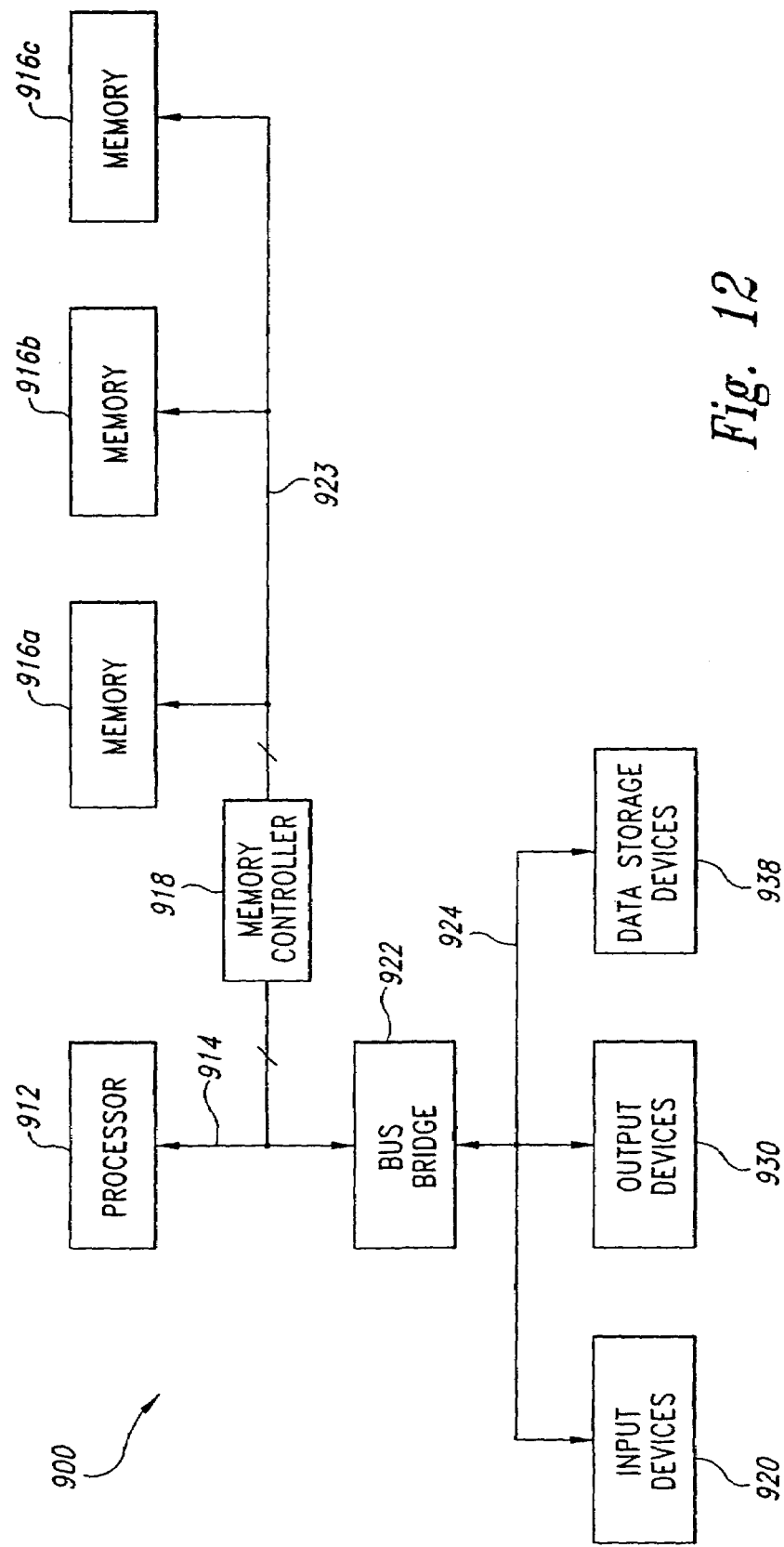
FIG. 12 is a functional block diagram of a computer system including a number of the SLDRAMs of FIG. 1, each containing the pattern generator and synchronization circuit of FIG. 4.

An example of a computer system 900 using the synchronous link architecture is shown in FIG. 12. The computer system 900 includes a processor 912 having a processor bus 914 coupled through a memory controller 918 and system memory bus 923 to three packetized or synchronous link dynamic random access memory ("SLDRAM") devices 916*a–c*. The computer system 910 also includes one or more input devices 920, such as a keypad or a mouse, coupled to the processor 912 through a bus bridge 922 and an expansion bus 924, such as an industry standard architecture ("ISA") bus or a peripheral component interconnect ("PCI") bus. The input devices 920 allow an operator or an electronic device to input data to the computer system 900. One or more output devices 930 are coupled to the processor 912 to display or otherwise output data generated by the processor 912. The output devices 930 are coupled to the processor 912 through the expansion bus 924, bus bridge 922 and processor bus 914. Examples of output devices 930 include printers and a video display units. One or more data storage devices 938 are coupled to the processor 912 through the processor bus 914, bus bridge 922, and expansion bus 924 to store data in or retrieve data from storage media (not shown). Examples of storage devices 938 and storage media include fixed disk drives floppy disk drives, tape cassettes and compact-disk read-only memory drives.

In operation, the processor 192 sends a data transfer command via the processor bus 914 to the memory controller 918, which, in turn, communicates with the memory devices 916*a–c* via the system memory bus 923 by sending the memory devices 916*a–c* command packets that contain both control and address information. Data is coupled between the memory controller 918 and the memory devices 916*a–c* through a data bus portion of the system memory bus 922. During a read operation, data is transferred from the SLDRAMs 916*a–c* over the memory bus 923 to the memory controller 918 which, in turn, transfers the data over the processor bus 914 to the processor 912. The processor 912 transfers write data over the processor bus 914 to the memory controller 918 which, in turn, transfers the write data over the system memory bus 923 to the SLDRAMs 916*a–c*. Although all the memory devices 916*a–c* are coupled to the same conductors of the system memory bus 923, only one memory device 916*a–c* at a time reads or writes data, thus avoiding bus contention on the memory bus 923. Bus contention is avoided by each of the memory devices 916*a–c* on the system memory 923 having a unique identifier, and the command packet contains an identifying code that selects only one of these components.

The computer system 900 typically also includes a number of other components and signal lines that have been omitted from FIG. 12 in the interests of brevity. For example, the memory devices 916*a–c* also receive a command clock signal CCLK to provide internal timing signals, data clock signals DCLK0 and DCLK1 for clocking data into and out of the memory devices 916, and a FLAG signal signifying the start of a command packet and utilized to place the memory devices 916 in synchronization mode, as previously explained.

It is to be understood that even though various embodiments and advantages of the present invention have been set forth in the foregoing description, the above disclosure is illustrative only, and changes may be made in detail, and yet remain within the broad principles of the invention. For example, many of the components described above may be implemented using either digital or analog circuitry, or a combination of both, and also, where appropriate, may be realized through software executing on suitable processing circuitry. Therefore, the present invention is to be limited only by the appended claims.

The invention claimed is:

1. A method of generating expect signals for synchronizing a memory bus of a memory device to which synchronizing signals are applied, the method comprising:
   receiving on the bus a plurality of synchronizing signals representing a stream of binary digits;
   capturing a group of the synchronizing signals; and
   generating a plurality of expect signals based on the binary digits represented by the captured signals for comparison to the synchronizing signals received subsequent to the captured group of synchronizing signals.

2. The method of claim 1 wherein capturing the group of the synchronizing signals comprises capturing a group of the synchronizing signals not including the first of the synchronizing signals.

3. The method of claim 1 wherein receiving the plurality of synchronizing signals comprises receiving a plurality of synchronizing signals representative of a pseudo-random sequence of binary digits.

4. The method of claims 3 wherein the plurality of synchronizing signals comprises the repeating bit sequence of "111101011001000."

5. The method of claim 3 wherein generating the plurality of expect signals based on the bits represented by the captured signals comprises generating a plurality of expect signals corresponding to a stream of binary digits having the pseudo-random sequence of binary digits continuing from the sequence of binary digits of the captured group of the synchronizing signals.

6. The method of claim 1 wherein capturing a group of the synchronizing signals comprises capturing a group of the synchronizing signals corresponding to four binary digits.

7. The method of claim 6 wherein receiving the plurality of synchronizing signals comprises receiving a plurality of synchronizing signals representative of a repeating 15-bit pseudo-random sequence of binary digits.

8. A method for generating expect signals in response to receiving digital signals representative of a repeating sequence of digital signals on a memory bus provided for synchronizing the memory bus, the method comprising:
   capturing a group of digital signals of the repeating sequence of digital signals; and based on the bit sequence of the captured group of digital signals, generating in response thereto expect signals representing a bit stream of expect data to which the synchronizing signals are compared.

9. The method of claim 8 wherein the repeating sequence of digital signals comprises a pseudo-random sequence of binary digits.

10. The method of claim 9 wherein the pseudo-random sequence of binary digits comprises the repeating bit sequence of "111101011001000."

11. The method of claim 8 wherein capturing a group of digital signals comprises capturing a group of digital signals representative of four bits.

12. The method of claim 11 wherein the stream of binary digits having the pseudo-random sequence of binary digits comprises a 15-bit pseudo-random sequence of binary digits.

13. The method of claim 8 wherein the captured group of digital signals does not include the digital signal representing the first digit of the sequence of digital signals.

14. The method of claim 13 wherein the repeating sequence of digital signals comprises a repeating 15-bit pseudo-random sequence of binary digits.

15. The method of claim 8 wherein the repeating sequence of digital signals comprises repeating a pseudo-random sequence of binary digits and generating expect signals representing a bit stream of expected data comprises generating expect signals representing a stream of bits having the pseudo-random sequence following the sequence of the captured group of digital signals.

16. A method for generating an expect data pattern from an applied bit stream having a known pattern, comprising capturing a seed group of bits from the applied bit stream, and generating an expected group of bits having values determined by the values of the captured seed group of bits.

17. The method of claim 16 wherein the applied bit stream comprises a 15-bit pseudo-random bit sequence.

18. The method of claim 17 wherein generating an expected group of bits comprises generating a stream of bits starting with the sequence of bits of the seed group and continuing the pseudo-random bit sequence thereafter.

19. The method of claim 17 wherein the 15 bit pseudo-random bit sequence comprises the repeating bit sequence of "111101011001000."

20. The method of claim 16 wherein the captured seed group of bits includes 4 bits.

21. The method of claim 16 wherein the seed group of bits captured does not include the first bit of the applied bit stream.

22. A method of generating a sequence of digital signals for synchronizing a bus of a memory device, the method comprising:

repetitively applying digital signals to the bus in a known repeating sequence;

storing a group of digital signals; and generating a series of expect data groups, each expect data group including a plurality of expect digital signals having values determined in response to the values of expect digital signals in the preceding expect data group, and the values of the digital signals in the first expect data group being determined responsive to digital signals from one of the captured groups of digital signals.

23. The method of claim 22 wherein repetitively applying digital signals comprises applying a repeating 15 bit pseudo-random bit sequence of digital signals.

24. The method of claim 23 wherein the 15 bit pseudo-random bit sequence comprises the repeating bit sequence of "111101011001000."

25. The method of claim 22 wherein each group comprises four digital signals.

26. The method of claim 22 wherein the group of digital signals stored does not include the first bit of the applied bit stream.

27. The method of claim 22 wherein generating a series of expect data groups comprises generating a stream of bits having the known repeating sequence beginning with the sequence of the stored group of digital signals.

28. A method for generating a sequence of expected data for use in synchronizing a memory bus, the method comprising:

applying a repeating pseudo-random sequence of binary digits to the bus;

selecting a 4-bit group of the pseudo-random sequence; and based on the bit sequence of the 4-bit group, generating the repeating pseudo-random sequence of binary digits beginning with the four bits of the 4-bit group and continuing the pseudo-random sequence therefrom.

29. The method of claim 28 wherein applying a repeating pseudo-random sequence of binary digits comprises applying a 15-bit repeating pseudo-random sequence of binary digits.

30. The method of claim 29 wherein the 15-bit repeating pseudo-random sequence of binary digits comprises the repeating bit sequence of "111101011001000."

31. The method of claim 28 wherein the selected 4-bit group does not include the first bit of the repeating pseudo-random sequence of binary digits.

* * * * *